(12) United States Patent
Toda

(10) Patent No.: US 11,122,227 B2
(45) Date of Patent: Sep. 14, 2021

(54) IMAGE SENSOR, IMAGE CAPTURING SYSTEM, AND PRODUCTION METHOD OF IMAGE SENSOR

(71) Applicant: SONY CORPORATION, Tokyo (JP)

(72) Inventor: Atsushi Toda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/845,964

(22) Filed: Apr. 10, 2020

(65) Prior Publication Data
US 2020/0244904 A1 Jul. 30, 2020

Related U.S. Application Data

(63) Continuation of application No. 16/060,106, filed as application No. PCT/JP2016/086239 on Dec. 6, 2016, now Pat. No. 10,681,292.

(30) Foreign Application Priority Data

Dec. 15, 2015 (JP) .................................. 2015-244083

(51) Int. Cl.
*H04N 5/369* (2011.01)
*H01L 27/146* (2006.01)
(Continued)

(52) U.S. Cl.
CPC ....... *H04N 5/36965* (2018.08); *G01S 7/4816* (2013.01); *G01S 17/86* (2020.01);
(Continued)

(58) Field of Classification Search
CPC .... H04N 5/36965; H04N 5/332; G01S 17/86; G01S 17/931; G01S 7/4816;
(Continued)

(56) References Cited

U.S. PATENT DOCUMENTS 9,184,198 B1 * 11/2015 Miao ................ H01L 27/14634
10,681,292 B2 * 6/2020 Toda ................ H01L 27/14652
(Continued)

FOREIGN PATENT DOCUMENTS

JP 2003-029027 1/2003
JP 2007-220832 8/2007
(Continued)

OTHER PUBLICATIONS

Official Action (no English translation available) for Japanese Patent Application No. 2015-244083, dated Apr. 28, 2020, 6 pages.

*Primary Examiner* — Marnie A Matt
(74) *Attorney, Agent, or Firm* — Sheridan Ross P.C.

(57) ABSTRACT

There is provided an imaging device, an electronic apparatus including an imaging device, and an automotive vehicle including an electronic apparatus including an imaging device, including: a first substrate including a first set of photoelectric conversion units; a second substrate including a second set of photoelectric conversion units; and an insulating layer between the first substrate and the second substrate; where the insulating layer has a capability to reflect a first wavelength range of light and transmit a second wavelength range of light that is longer than the first wavelength range of light.

10 Claims, 17 Drawing Sheets

(51) Int. Cl.

| | | |
|---|---|---|
| *G02B 5/20* | (2006.01) | |
| *G02B 5/28* | (2006.01) | |
| *G01S 7/481* | (2006.01) | |
| *G02B 5/26* | (2006.01) | |
| *H01L 23/00* | (2006.01) | |
| *H04N 5/33* | (2006.01) | |
| *G01S 17/86* | (2020.01) | |
| *G01S 17/931* | (2020.01) | |

(52) U.S. Cl.
CPC ............ *G01S 17/931* (2020.01); *G02B 5/201* (2013.01); *G02B 5/208* (2013.01); *G02B 5/26* (2013.01); *G02B 5/281* (2013.01); *H01L 24/29* (2013.01); *H01L 24/32* (2013.01); *H01L 27/14629* (2013.01); *H01L 27/14634* (2013.01); *H01L 27/14636* (2013.01); *H01L 27/14647* (2013.01); *H01L 27/14652* (2013.01); *H01L 27/14685* (2013.01); *H04N 5/332* (2013.01); *H01L 27/1464* (2013.01); *H01L 27/1469* (2013.01); *H01L 27/14689* (2013.01); *H01L 2224/2908* (2013.01); *H01L 2224/29188* (2013.01); *H01L 2224/30505* (2013.01); *H01L 2224/32145* (2013.01); *H01L 2924/05042* (2013.01); *H01L 2924/05341* (2013.01); *H01L 2924/05442* (2013.01)

(58) Field of Classification Search
CPC ... H01L 27/14634; H01L 24/29; H01L 24/32; H01L 27/14652; H01L 27/14629; H01L 27/14636; H01L 27/14647; H01L 27/14685; H01L 27/1469; H01L 27/1464; H01L 27/14689; H01L 2224/2908; H01L 2224/29188; H01L 2224/30505; H01L 2224/32145; H01L 2924/05042; H01L 2924/05341; H01L 2924/05442; G02B 5/281; G02B 5/201; G02B 5/26; G02B 5/208
USPC ........................................................ 348/135
See application file for complete search history.

(56) References Cited

U.S. PATENT DOCUMENTS

| | | | |
|---|---|---|---|
| 2007/0188635 A1* | 8/2007 | Yamaguchi | H01L 27/14627 348/272 |
| 2010/0108885 A1* | 5/2010 | Samuelson | G02B 17/0808 250/338.1 |
| 2011/0079765 A1* | 4/2011 | Soma | H01L 31/107 257/13 |
| 2013/0183788 A1* | 7/2013 | Treeza | H01L 27/14636 438/66 |
| 2014/0367554 A1* | 12/2014 | Kuboi | H01L 27/1462 250/208.1 |
| 2015/0171146 A1* | 6/2015 | Ooki | H01L 27/14623 250/208.1 |
| 2016/0254300 A1* | 9/2016 | Wajs | H01L 27/14652 257/435 |
| 2018/0367746 A1* | 12/2018 | Toda | G02B 5/26 |

FOREIGN PATENT DOCUMENTS

| | | |
|---|---|---|
| JP | 2011-077467 | 4/2011 |
| JP | 2014-130890 | 7/2014 |
| JP | 2014-135535 | 7/2014 |
| JP | 2014-146894 | 8/2014 |
| JP | 2015-088691 | 5/2015 |

* cited by examiner

IMAGE SENSOR, IMAGE CAPTURING SYSTEM, AND PRODUCTION METHOD OF IMAGE SENSOR

CROSS REFERENCE TO RELATED APPLICATIONS

This application is a continuation of U.S. patent application Ser. No. 16/060,106 filed Jun. 7, 2018 which is a national stage application under 35 U.S.C. 371 and claims the benefit of PCT Application No. PCT/JP2016/086239 having an international filing date of 6 Dec. 2016, which designated the United States, which PCT application claimed the benefit of Japanese Priority Patent Application JP 2015-244083 filed Dec. 15, 2015, the entire contents of each of which are incorporated herein by reference.

TECHNICAL FIELD

The present disclosure relates to an image sensor, an image capturing system, an electronic apparatus including an image sensor, an automotive vehicle including an electronic apparatus including an image sensor, and a production method of an image sensor.

BACKGROUND ART

In the past, various types of solid-state image sensors that can simultaneously acquire both of an image of visible light and an image of infrared light were proposed to be applied to distance measurement or the like. As such, structures including a solid-state image sensor, a structure that arrays pixels that detect visible light (RGB pixels) and pixels that detect infrared light (IR pixel(s)) that were arranged in a horizontal direction were considered, including a structure where four pixels including RGB pixels and an IR pixel were arrayed. However, when the solid-state image sensor having this structure is compared with a solid-state image sensor in which the RGB pixels are configured to have a Bayer array, at least one of positions at which the pixels for the visible light are located in the normal Bayer array is replaced by the IR pixel, and this results in degradation of its resolution.

In order to prevent the degradation of the resolution in the above structure of the horizontal array, Patent Literature 1 (below) proposes a solid-state image sensor structure that stacks the pixels for the visible light and the pixels for the infrared light in the vertical direction to simultaneously acquire both of the image of the visible light and the image of the infrared light, for example.

CITATION LIST

Patent Literature

[PTL 1]
JP 2015-88691A

SUMMARY

Technical Problem

However, when the vertically stacked structure is used as proposed in the above Patent Literature 1, and the infrared light pixel is an avalanche multiplication light-emitting diode (avalanche photo diode: APD), such as a single photon avalanche diode (SPAD), for example, then high voltage must be applied to the APD, which means that a part of high voltage drive and a part of low voltage drive are created in the same substrate. As a result, it is difficult to design circuits of such vertically stacked structures that will work efficiently, and it is also problematic to design the structure because the pixel size differs between the visible light pixel and the infrared light pixel.

Thus, in consideration of the above circumstances, the present disclosure proposes an image sensor, an image capturing system, and a production method of an image sensor that can reduce or prevent degradation of resolution as well as mixed color, as well as provide improved separation of a drive circuit when simultaneously detecting light of two types of wavelength bands (e.g., visible and infrared light).

Solution to Problem

According to embodiments of the present disclosure, there is provided an image sensor including a light receiving unit that includes a long wavelength sensor array composed of a plurality of pixels that receive light of a long wavelength side among light of a predetermined wavelength band, an insulator layer that is positioned on the long wavelength sensor array, and reflects light of a short wavelength side among the light of the predetermined wavelength band, and allows the light of the long wavelength side to transmit through the insulator layer, and a short wavelength sensor array positioned on the insulator layer and composed of a plurality of pixels that receive the light of the short wavelength side. According to further embodiments of the present disclosure, there is provided an imaging device, an electronic apparatus including an imaging device, an automotive vehicle including an electronic apparatus including an imaging device, and methods for producing the same, where the imaging device includes: a first substrate including a first set of photoelectric conversion units; a second substrate including a second set of photoelectric conversion units; and an insulating layer between the first substrate and the second substrate; where the insulating layer has a capability to reflect a first wavelength range of light and transmit a second wavelength range of light that is longer than the first wavelength range of light.

According to embodiments of the present disclosure, there is provided an image capturing system including: an image sensor including a light receiving unit that includes a long wavelength sensor array composed of a plurality of pixels that receive light of a long wavelength side among light of a predetermined wavelength band, an insulator layer that is positioned on the long wavelength sensor array, and reflects light of a short wavelength side among the light of the predetermined wavelength band, and allows the light of the long wavelength side to transmit through the insulator layer, and a short wavelength sensor array positioned on the insulator layer and composed of a plurality of pixels that receive the light of the short wavelength side, and an optical filter that is positioned at a prior stage of the light receiving unit, and allows light of a part of a wavelength band among the light of the long wavelength side to transmit through the optical filter; and a light source that emits light of a wavelength band that transmits through the optical filter.

According to embodiments of the present disclosure, there is provided a production method of an image sensor, including: forming a short wavelength sensor array composed of a plurality of pixels that receive light of a short wavelength side among light of a predetermined wavelength band, on a predetermined substrate; forming a long wavelength sensor array composed of a plurality of pixels that receive light of a long wavelength side among the light of the predetermined wavelength band, on the predetermined substrate; and providing the short wavelength sensor array at one side of an insulator that reflects the light of the short wavelength side and allows the light of the long wavelength side to transmit through the insulator, and locating the long wavelength sensor array at another side of the insulator.

According to embodiments of the present disclosure, the short wavelength sensor array of the light receiving unit receives the light of the short wavelength side among the light of a predetermined wavelength band, and the long wavelength sensor array of the light receiving unit receives the light of the long wavelength side among the light of the predetermined wavelength band. Also, the short wavelength sensor array and the long wavelength sensor array are electrically separated by an insulator layer that reflects the light of the short wavelength side among the light of the predetermined wavelength band and allow the light of the long wavelength side to transmit through the insulator layer.

Advantageous Effects of Invention

As described above, according to embodiments of the present disclosure, the degradation of the resolution is reduced or prevented, mixed color is reduced or prevented, and there is improved separation of the drive circuit when light of two types of the wavelength bands (e.g., visible and infrared light) are detected simultaneously.

The advantageous effects described herein are not limitative. With or in the place of the effects described herein, there may be achieved any one or more of the effects described herein or other effects.

DESCRIPTION OF EMBODIMENTS

Figure 1:
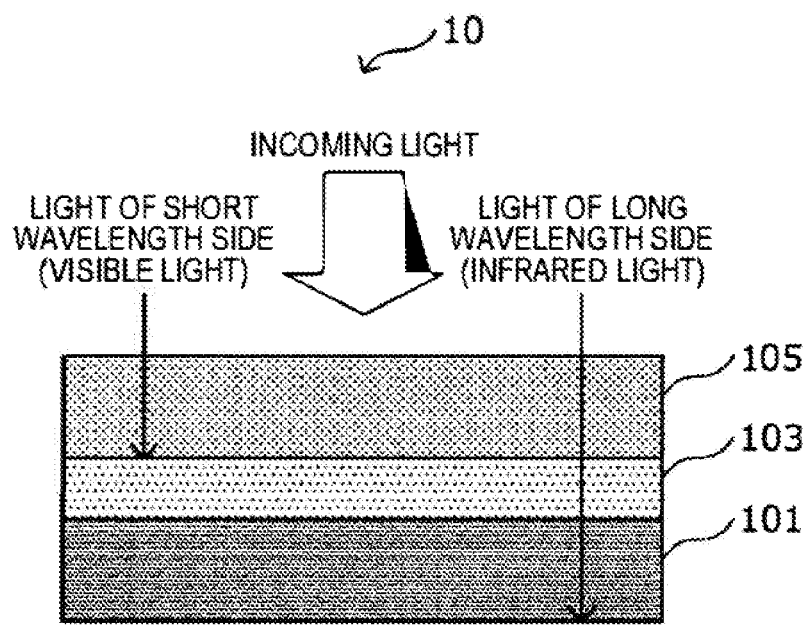
FIG. 1 is an illustrative diagram that schematically shows an overall structure of an image sensor according to an embodiment of the present disclosure.

Hereinafter, (an) embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

Note that description will be made in the following order.
1. Embodiments
1.1. with Regard to Overall Structures of Image Sensor
1.2. with Regard to Production Methods of Image Sensor
1.3. with Regard to Image Capturing Systems
1.4. with Regard to Specific Examples of Image Sensor

EMBODIMENTS

<With Regard to Overall Structures of Image Sensor>

Figure 3A:
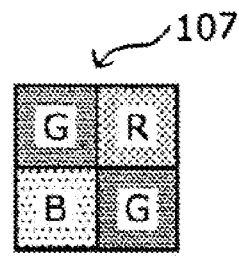
FIG. 3A is an illustrative diagram that schematically shows an example of a location pattern of a visible light wavelength selection filter in an image sensor according to this embodiment.
Figure 3B:
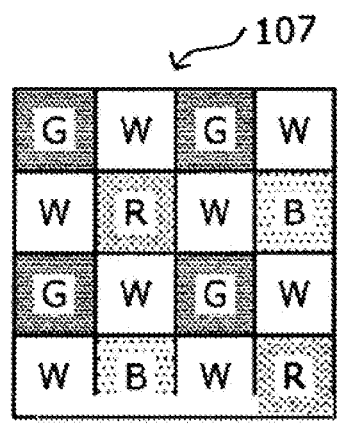
FIG. 3B is an illustrative diagram that schematically shows an example of a location pattern of a visible light wavelength selection filter in an image sensor according to this embodiment.
Figure 4A:
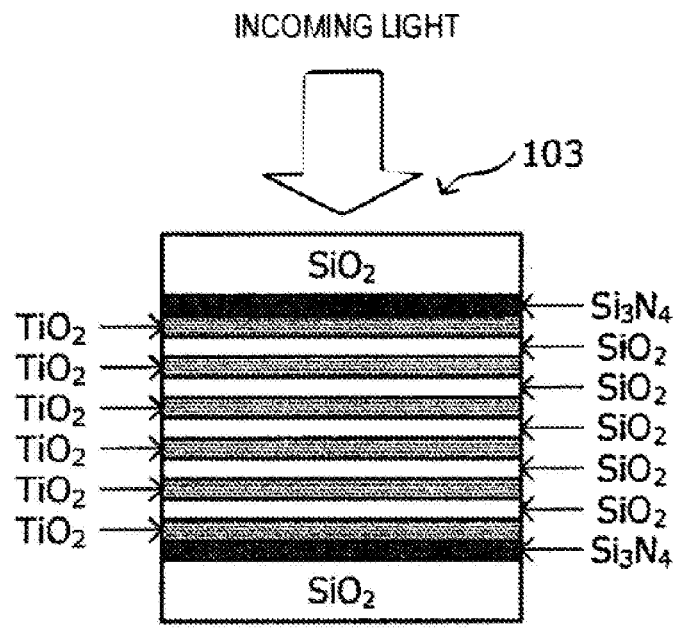
FIG. 4A is an illustrative diagram that schematically shows an example of an insulator layer according to this embodiment.
Figure 4B:
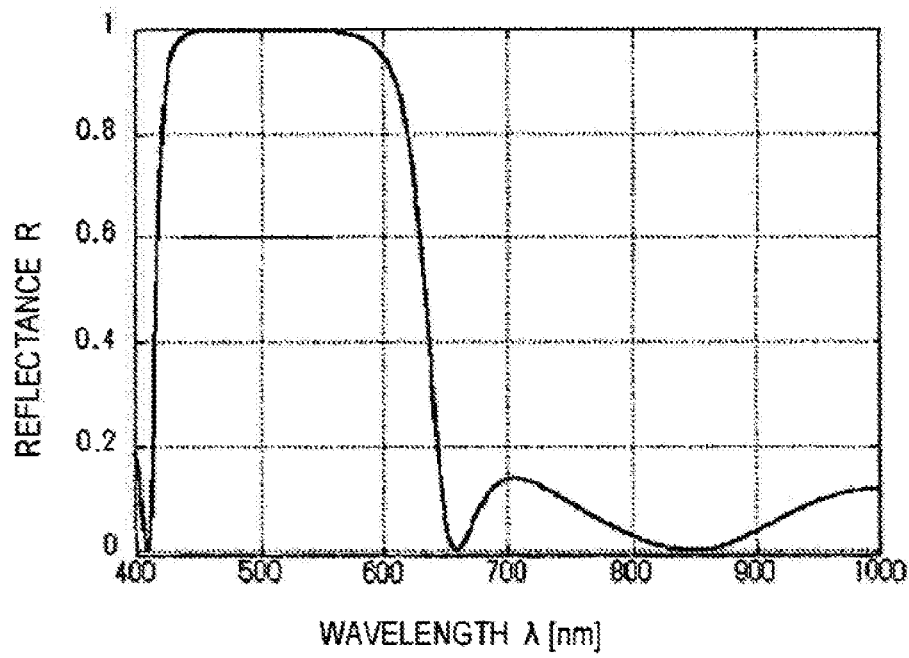
FIG. 4B is an illustrative graph diagram that shows an example of reflection characteristics of an insulator layer according to this embodiment.
Figure 5:
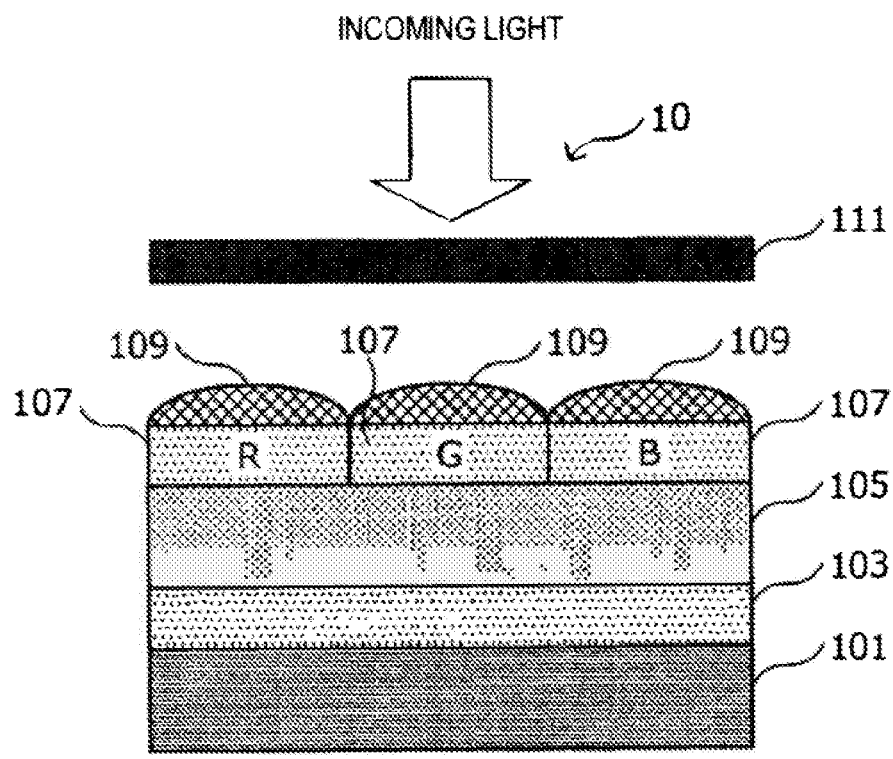
FIG. 5 is an illustrative diagram that schematically shows an overall structure of an image sensor according to this embodiment.
Figure 6A:
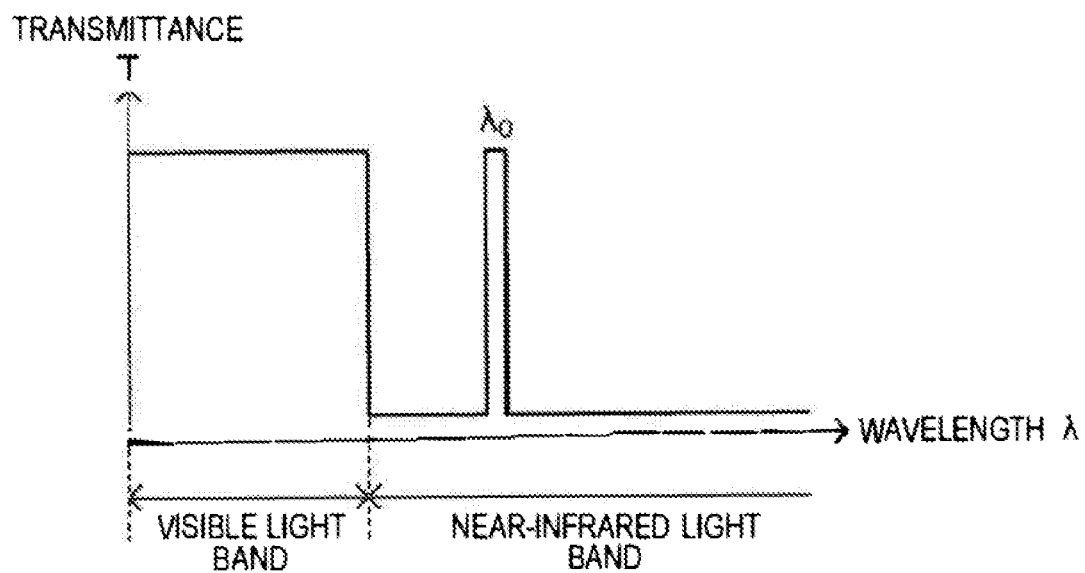
FIG. 6A is an illustrative diagram for describing an example of optical characteristics of an optical filter in an image sensor according to this embodiment.
Figure 6B:
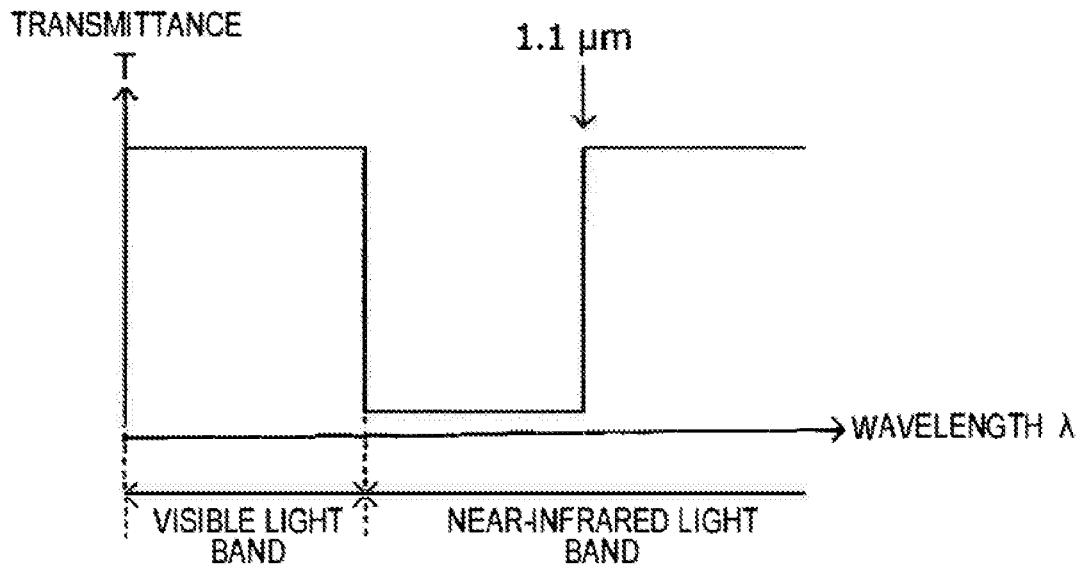
FIG. 6B is an illustrative diagram for describing an example of optical characteristics of an optical filter in an image sensor according to this embodiment.
Figure 7A:
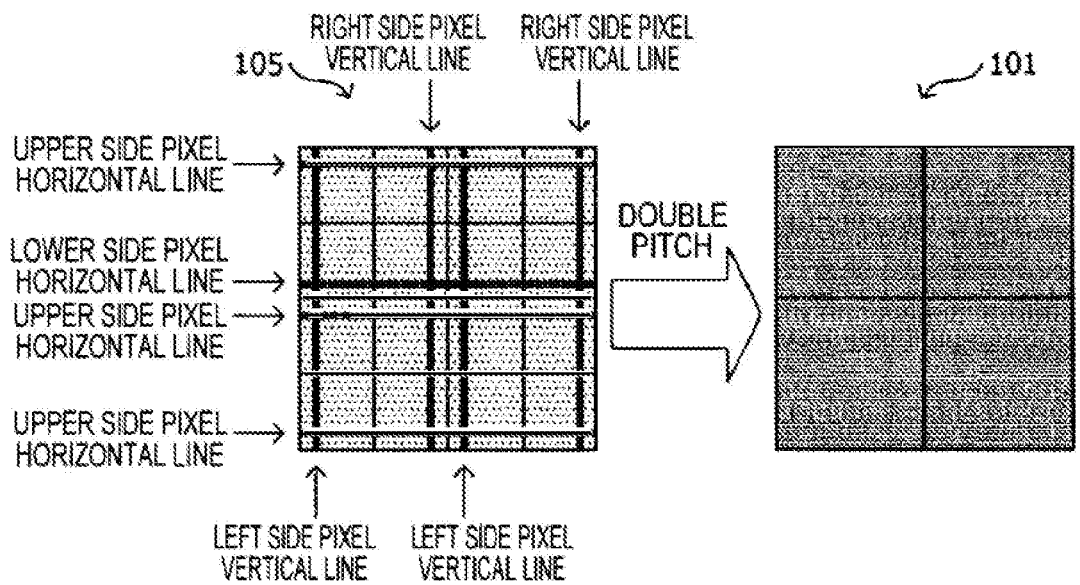
FIG. 7A is an illustrative diagram that schematically shows a line example of a short wavelength sensor array in an image sensor according to this embodiment.
Figure 7B:
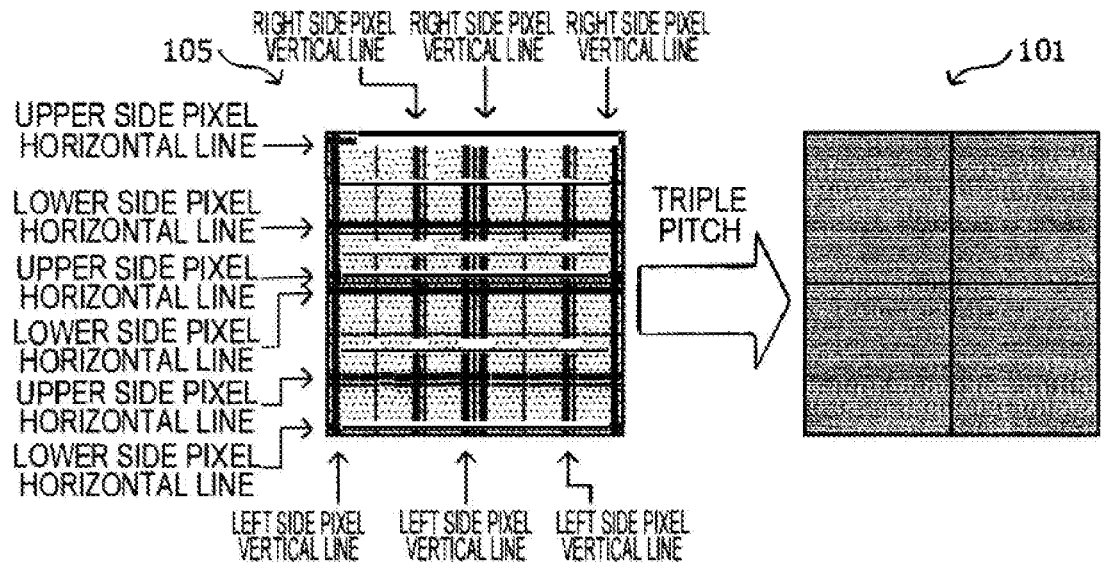
FIG. 7B is an illustrative diagram that schematically shows a line example of a short wavelength sensor array in an image sensor according to this embodiment.
Figure 8A:
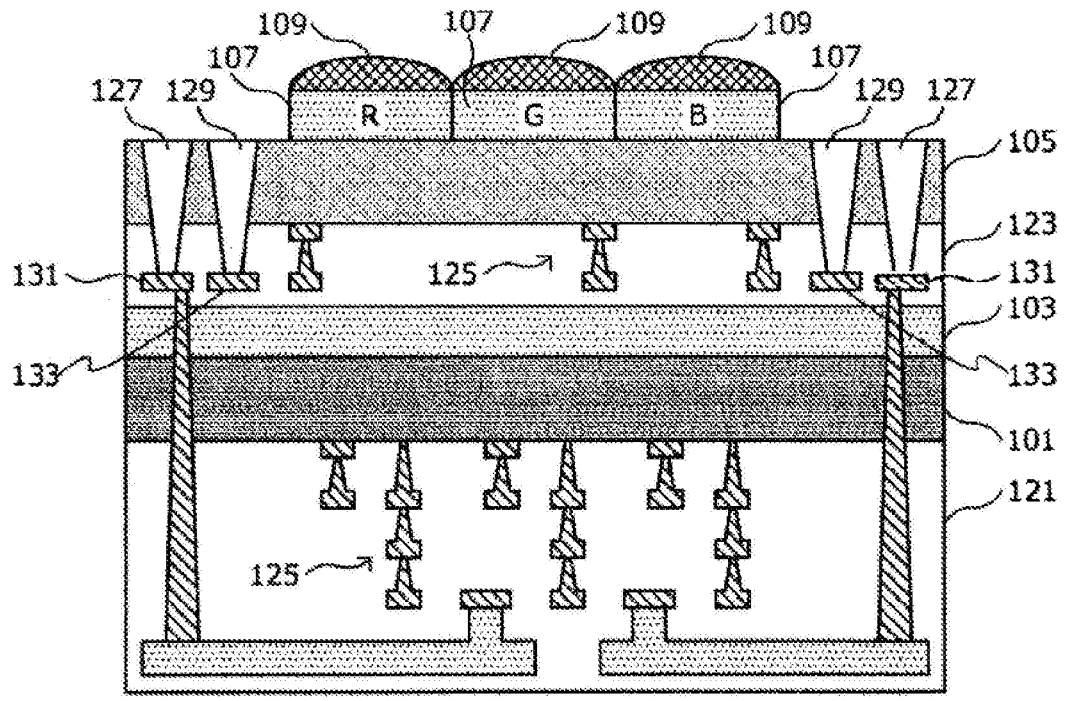
FIG. 8A is an illustrative diagram that schematically shows a line example in an image sensor according to this embodiment.
Figure 8B:
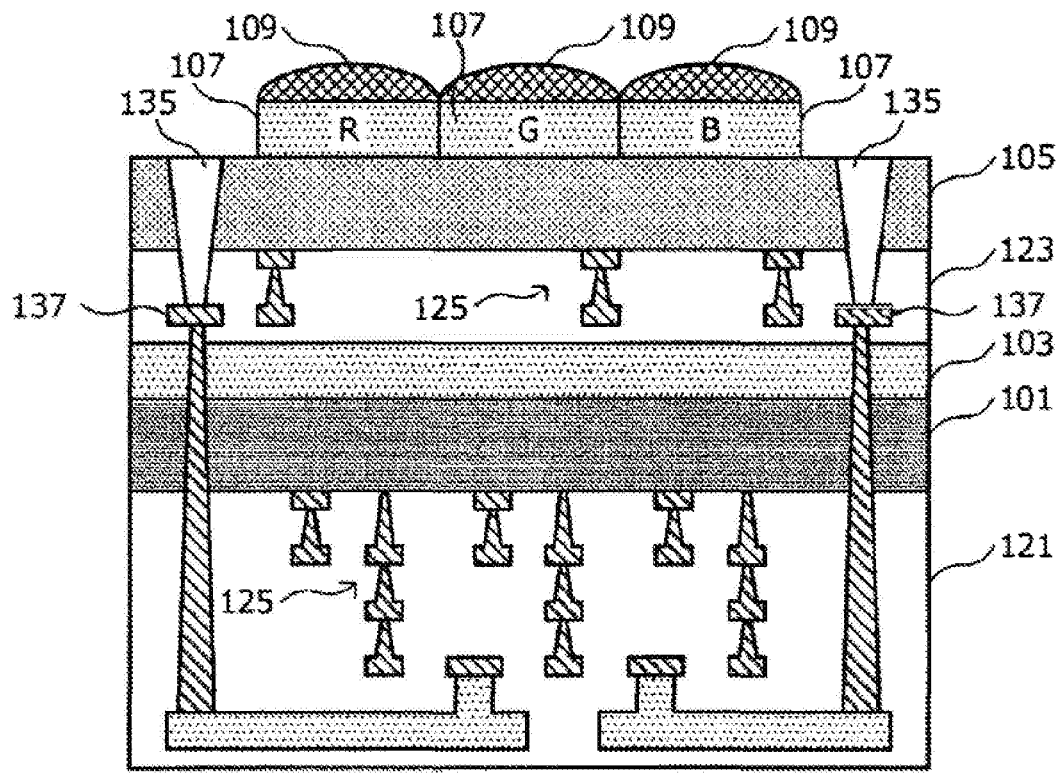
FIG. 8B is an illustrative diagram that schematically shows a line example in an image sensor according to this embodiment.
Figure 9:
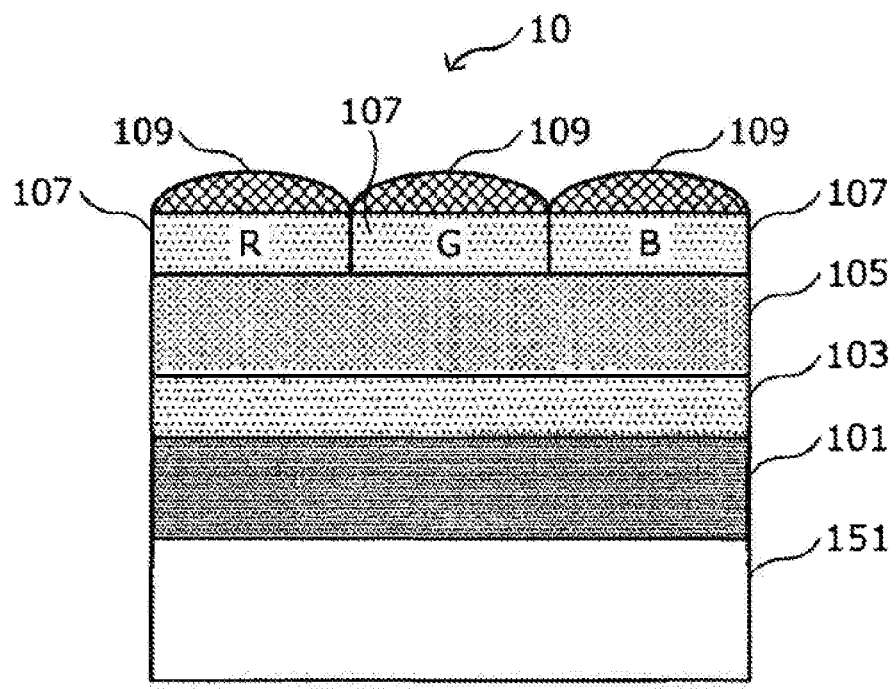
FIG. 9 is an illustrative diagram that schematically shows an overall structure of an image sensor according to this embodiment.

First, an overall structure of an image sensor according to embodiments of the present disclosure will be described in detail with reference to FIGS. 1 to 9. FIGS. 1 to 2B are explanatory diagrams that schematically illustrate the overall structure of the image sensor according to a present embodiment. FIGS. 3A and 3B are explanatory diagrams that schematically illustrate examples of a location pattern of a visible light wavelength selection filter in the image sensor according to the present embodiment. FIG. 4A is an explanatory diagram that schematically illustrates an example of an insulator layer according to the present embodiment, and FIG. 4B is a graph diagram that illustrates an example of reflection characteristics of the insulator layer according to the present embodiment. FIG. 5 is an explanatory diagram that schematically illustrates the overall structure of the image sensor according to the present embodiment. FIGS. 6A and 6B are explanatory diagrams for describing examples of optical characteristics of an optical filter in the image sensor according to the present embodiment. FIGS. 7A and 7B are explanatory diagrams that schematically illustrate line examples of a short wavelength sensor array in the image sensor according to the present embodiment. FIGS. 8A and 8B are explanatory diagrams that schematically illustrate line examples in the image sensor according to the present embodiment. FIG. 9 is an explanatory diagram that schematically illustrates the overall structure of the image sensor according to the present embodiment.

The image sensor 10 according to the present embodiment is a CMOS image sensor for example, and includes a light receiving unit that includes a long wavelength sensor array 101, an insulator layer 103, and a short wavelength sensor array 105, as schematically illustrated in FIG. 1.

Incoming light of a predetermined wavelength band (e.g., light in the visible light spectrum and light in the infrared light spectrum) enters into the image sensor 10. The long wavelength sensor array 101 is a sensor array that includes a plurality of pixels that receive light of a relatively long wavelength side (e.g., light in the infrared light spectrum) from the incoming light. This long wavelength sensor array 101 is formed by using photoelectric conversion material that converts the light of the long wavelength side to electric charge (for example, electrons) in an amount that corresponds to an amount of the detected light of the long wavelength side.

The insulator layer 103 is positioned on the long wavelength sensor array 101. The insulator layer 103 reflects the light of the relatively short wavelength side (e.g., light in the visible light spectrum) from the incoming light of the predetermined wavelength band that enters into the image sensor 10, and allows the light of the long wavelength side to transmit through the insulator layer 103.

The short wavelength sensor array 105 is positioned on the insulator layer 103. The short wavelength sensor array 105 is a sensor array that includes a plurality of pixels that receive the light of the relatively short wavelength side from the incoming light of the predetermined wavelength band that enters into the image sensor 10. This short wavelength sensor array 105 is formed by using photoelectric conversion material that converts the light of the short wavelength side to electric charge (for example, electrons) in an amount that corresponds to an amount of the detected light of the short wavelength side.

In various embodiments, it may be preferable that the long wavelength sensor array 101 and the short wavelength sensor array 105 are formed in such a manner that the wavelengths of the amounts of light to be detected differ from each other, and thus it may be preferable that the photoelectric conversion material used in the long wavelength sensor array 101 and the photoelectric conversion material used in the short wavelength sensor array 105 differ from each other.

As is illustrated in FIG. 1, the image sensor 10 according to the present embodiment is a stacked image sensor in which the long wavelength sensor array 101 and the short wavelength sensor array 105 are located vertically via the insulator layer 103 (e.g., in a depth direction relative to the substrate).

Thus, as shown by the illustrative structure in FIG. 1, the light receiving unit of the image sensor 10 according to the present embodiment detects the light of the short wavelength side with the short wavelength sensor array 105 that is positioned at the upper portion (e.g., a side closest to a light-receiving side of the structure). Also, the light of the short wavelength side is unable to transmit through the insulator layer 103, and thus the light of the short wavelength side that reaches an interfacial surface between the short wavelength sensor array 105 and the insulator layer 103 is reflected to the short wavelength sensor array 105 side. Thereby, the detection sensitivity of the short wavelength sensor array 105 is improved and the light of the short wavelength side is prevented from reaching the long wavelength sensor array 101, and thus the mixed color of the long wavelength sensor array 101 can be prevented. Also, the light of the long wavelength side transmits through the short wavelength sensor array 105 and the insulator layer 103, and reaches the long wavelength sensor array 101, and is detected by the long wavelength sensor array 101.

In various embodiments, it may be preferable that the wavelength band of interest in the incoming light is from the visible light band to the infrared light band, in the image sensor 10 according to the present embodiment. When this wavelength band is from the visible light band to the infrared light band, it may be preferable that the short wavelength sensor array 105 is set to a visible light sensor array that detects visible light which is light of relatively short wavelength, and the long wavelength sensor array 101 is set to an infrared light sensor array that detects infrared light which is light of relatively long wavelength. As described below, when the incoming light is from the visible light band to the infrared light band, the detailed description describes an illustrative case in which the short wavelength sensor array 105 is a visible light sensor array, and the long wavelength sensor array 101 is an infrared light sensor array.

In some embodiments, an infrared light detection sensor array that uses a photoelectric conversion material that can detect infrared light can be utilized as the long wavelength sensor array 101 that functions as the infrared light sensor array. Various types of semiconductor materials that can detect the infrared light can be utilized as the photoelectric conversion material, which can include one or more of at least InGaAs, $FeS_2$, CuInGaSe, and Si, for example. Also, an avalanche multiplication diode (APD) (e.g., a carrier multiplication diode), such as a single photon avalanche diode (Single Photon Avalanche Diode: SPAD), can be utilized as the infrared light detection sensor array, for example.

In some embodiments, a visible light detection sensor array that uses a photoelectric conversion material that can detect visible light can be utilized as the short wavelength sensor array 105 that functions as the visible light sensor array. This photoelectric conversion material can be various types of semiconductors including compound semiconductors. In various embodiments, it may be easier and convenient to use a photoelectric conversion material that includes at least Si, for example.

As illustrated in FIG. 1, the insulator layer 103 is arranged between the long wavelength sensor array 101 and the short wavelength sensor array 105. When the long wavelength sensor array 101 functions as the infrared light sensor array, and the short wavelength sensor array 105 functions as the visible light sensor array, it may be preferable that this insulator layer 103 is formed by using an insulator that reflects the visible light and allows the infrared light to transmit through the insulator. It also may be preferable to use an insulator multilayer film in which a plurality of insulators are stacked in a plurality of layers.

As described above, the image sensor 10 according to the present embodiment is advantageous over the prior art because, for example, the pixels of the infrared optical sensor do not need to be located in an area that would otherwise be a part of the pixels of the visible light sensor array (e.g., at the sacrifice of a part of the pixels of the visible light sensor array) as was done in the past. In contrast, in various embodiments described herein, by separating the long wavelength sensor array 101 and the short wavelength sensor array 105 into top and bottom by the insulator layer 103 (e.g., separating the long wavelength sensor array 101 and the short wavelength sensor array 105 in a vertical or depth direction with respect to the substrate), the degradation of the resolution can be reduced as compared with an image sensor (for example, a CMOS image sensor) in which the visible light/infrared light pixels are arrayed in the horizontal direction.

Also, when a carrier multiplication sensor array such as the APD is used as the long wavelength sensor array 101 that functions as the infrared light sensor array, the short wavelength sensor array 105 that functions as the visible light sensor array can be driven with low drive voltage (e.g., about 2V to about 5V), and the long wavelength sensor array 101 can be driven with high drive voltage (e.g., about 10V to about 30V, or about 15V to about 25V). As described above, according to the image sensor 10 of the present embodiment, even when different voltage drives are to be used, the long wavelength sensor array 101 and the short wavelength sensor array 105 can be separated electrically by the insulator layer 103. As a result, the circuit design of the image sensor 10 becomes extremely easy compared to the past.

Figure 2A:
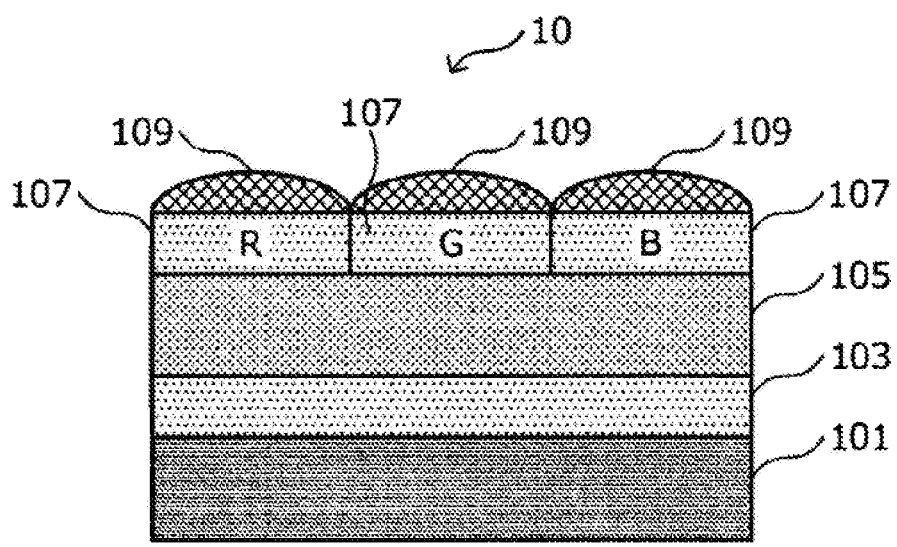
FIG. 2A is an illustrative diagram that schematically shows an overall structure of an image sensor according to this embodiment.
Figure 2B:
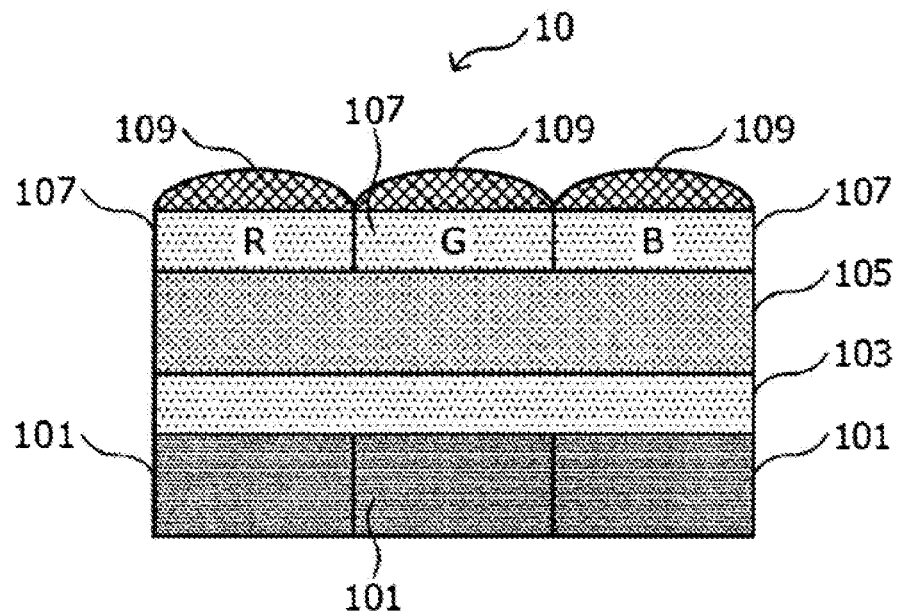
FIG. 2B is an illustrative diagram that schematically shows an overall structure of an image sensor according to this embodiment.

In various embodiments, it may be preferable to further provide a visible light wavelength selection filter 107 and a light collection structural element 109, as illustrated in FIG. 2A, at an upper portion of the short wavelength sensor array 105 in the image sensor 10 (e.g., the visible light wavelength selection filter 107 and the light collection structural element 109 may be located at a position that is closer to incoming light than the short wavelength sensor array 105).

The visible light wavelength selection filter 107 is not limited by the description herein, and may be formed by using a material that allows the light of a wavelength band to transmit through, and also absorbs or reflects the light of another wavelength band. The material allowing such transmittance and absorption/reflection may be chosen depending on a desired wavelength band to form an image at the pixel of the short wavelength sensor array 105.

In various embodiments, it may be preferable to provide a light collection structural element (for example, an On-Chip-Lens: OCL) 109 for causing the light that enters into the pixel of the short wavelength sensor array 105 of interest to form a desired image on the short wavelength sensor array 105, in the upper portion of the visible light wavelength selection filter 107. FIG. 2A illustrates a case in which the light collection structural element 109 has a convex lens shape, but the shape of the light collection structural element 109 is not limited by the description herein, and the shape of the light collection structural element 109 may have any shape according to desired light collection characteristics. Such a light collection structural element 109 can be formed by using an optical material that has a desired refractive index, for example.

The long wavelength sensor array 101 according to the present embodiment may be shared by a plurality of pixels of the short wavelength sensor array 105 as illustrated in FIG. 2A, and may be separately provided for each individual pixel of the short wavelength sensor array 105 as illustrated in FIG. 2B. For example, there may be individual sections of the long wavelength sensor array 101 that are respectively provided for each individual pixel, whereas the short wavelength sensor array 105 may be shared amongst a plurality of the pixels, as shown in FIG. 2B, for example. When the long wavelength sensor array 101 is shared by the pixels of the short wavelength sensor array 105 as illustrated in FIG. 2A, the sensitivity of the long wavelength sensor array 101 can be additionally improved. Also, when the long wavelength sensor arrays 101 are provided separately for the individual pixels of the short wavelength sensor array 105 as illustrated in FIG. 2B, the resolution of the long wavelength sensor array 101 can be additionally improved.

Also, the pattern of colors for the visible light wavelength selection filter 107 is not limited by the description herein. For example, the R filters made of color filters that allow reddish light to transmit through, the G filters made of color filters that allow greenish light to transmit through, and the B filters made of color filters that allow bluish light to transmit through may be located to form a Bayer array as illustrated in FIG. 3A. Also, in the visible light wavelength selection filter 107, W filters composed of white filters that allow the light of the visible light band to transmit through may be used in addition to the above three types of color filters, and these four types of color filters may be located to form a white checker array as illustrated in FIG. 3B.

Next, an example of the insulator layer 103 that is provided in the image sensor 10 according to the present embodiment will be described with reference to FIGS. 4A and 4B. In various embodiments, it may be preferable that the insulator layer 103 uses the insulator multilayer film in which a plurality of insulators are stacked in a plurality of layers, when the long wavelength sensor array 101 functions as the infrared light sensor array and the short wavelength sensor array 105 functions as the visible light sensor array. This insulator multilayer film is not limited by the description herein, and can utilize an insulator multilayer film of a multilayer structure made of $TiO_2$, $SiO_2$, and $Si_3N_4$, as illustrated in FIG. 4A, for example.

FIG. 4B illustrates the reflection spectrum characteristics of the insulator multilayer film made of $TiO_2$, $SiO_2$, and $Si_3N_4$. In FIG. 4B, the horizontal axis is wavelength (unit:

nm), and the vertical axis is reflectance. As can be seen in FIG. 4B, the reflectance is high in the visible light region that is equal to or smaller than wavelength 650 nm, and the reflectance is extremely low in the infrared light region that is equal to or larger than wavelength 800 nm. Thus, as shown by these reflection spectrum characteristics, by using this insulator multilayer film as the insulator layer 103, the infrared light can be transmitted while the visible light is reflected.

In various embodiments, it may be preferable that the image sensor 10 according to the present embodiment described above further includes an optical filter 111 that transmits a part of the light of the wavelength band among the incoming light of the long wavelength side, at a prior stage of the short wavelength sensor array 105 (e.g., a position closer to incoming light than the short wavelength sensor array 105). When the long wavelength sensor array 101 functions as the infrared light sensor array, and the short wavelength sensor array 105 functions as the visible light sensor array, the optical filter 111 functions as an infrared cut filter that transmits only a part of wavelength band $\lambda_0$ from the infrared light band. As described above, a part of the light of the long wavelength side is cut by the optical filter 111 to restrict the wavelength band of the light of the long wavelength side that enters into the short wavelength sensor array 105, and thereby the mixed color of the light of the long wavelength side into the short wavelength sensor array 105 is reduced, and the color reproducibility of the short wavelength sensor array 105 is additionally improved.

Note that the position of the location of the optical filter 111 is not limited by the description herein. The optical filter 111 may be location at a position that is a prior stage to the short wavelength sensor array 105 (e.g., a position closer to incoming light than the short wavelength sensor array 105), and the optical filter 111 may also be provided in position that is a prior stage of the light collection structural element 109 as illustrated in FIG. 5 (e.g., a position closer to incoming light than the light collection structural element 109). Further, a position of the optical filter 111 may be between the light collection structural element 109 and the visible light wavelength selection filter 107, and it may be between the visible light wavelength selection filter 107 and the short wavelength sensor array 105.

The optical characteristics of the optical filter 111 may be determined depending on the optical characteristics of the photoelectric conversion material of the short wavelength sensor array 105. For example, when Si is used as the photoelectric conversion material of the short wavelength sensor array 105, Si absorbs the near-infrared light up to wavelength 1.0 μm. Hence, it may be preferable that when the near-infrared light band equal to or smaller than wavelength 1.0 μm is selected as the wavelength band $\lambda_0$, the optical characteristics of the optical filter 111 are such that the optical filter 111 allows the visible light band to transmit through the optical filter 111 and also allows only a selective band (or extremely selective band) at the vicinity of the wavelength band $\lambda_0$ to transmit through the optical filter 111, as schematically illustrated in FIG. 6A. Also, even when Si is used as the photoelectric conversion material of the short wavelength sensor array 105, Si does not absorb the near-infrared light equal to or larger than a wavelength of 1.1 μm and thus the absorption of the near-infrared light in the short wavelength sensor array 105 is reduced when the wavelength band $\lambda_0$ is equal to or larger than 1.1 μm. In this case, it may be preferable that the optical characteristics of the optical filter 111 allow the visible light band and the near-infrared light band equal to or larger than a wavelength of 1.1 μm to transmit through the optical filter 111, and do not allow the near-infrared light smaller than a wavelength of 1.1 μm to transmit through the optical filter 111, as schematically illustrated in FIG. 6B. In this case, the upper limit of the wavelength of the infrared light that transmits through the optical filter 111 is not specified; however, it may be a wavelength that belongs to the mid-infrared light band, and it may be a wavelength that belongs to the far-infrared light band.

Next, wiring lines (also referred to as "lines" herein) of the short wavelength sensor array in the image sensor according to the present embodiment will be described with reference to FIGS. 7A and 7B. The lines, as described herein, can be any of a plurality of wiring layers coupled to pixel transistors, VDD, and vertical signal lines or other signal lines (e.g., lines can include the wiring 40 in FIG. 9, which is disposed in a wiring layer 41 and coupled to all pixel transistors and power voltages). In some cases, the lines of the short wavelength sensor array 105 that are positioned at the upper side (e.g., at a side closer to a light incident side) affect the light collection state of each pixel of the long wavelength sensor array 101 that is positioned at the lower side (e.g., at a side further from a light incident side). This influence resulting from the lines may be remarkable when the pixels of the long wavelength sensor array 101 are larger than the pixels of the short wavelength sensor array 105. For example, if the arrangement of the lines of each pixel is not ideal (e.g., the wiring lines are disposed under the boundary of the pixel blocks or the size of the pixel block is the same as the size of the IR pixel), then light will be shielded by the lines. In this case (as in FIGS. 7A and 7B), when the pixels of the long wavelength sensor array 101 are larger than the pixels of the short wavelength sensor array 105, this influence can be reduced by setting the repetition pitch (e.g., distance between the lines in each pixel) of the pixels in the long wavelength sensor array 101 to an integer that is a multiple of the repetition pitch of the pixels in the short wavelength sensor array 105. For example, this influence can be reduced by setting the pixel size of the long wavelength sensor array 101 to be m times and n times the vertical and the horizontal minimum repetitions (the on-chip color filter (OCCF) pitch) in the layout of the pixels of the short wavelength sensor array 101, respectively. In this example, each of m and n is an integer equal to or greater than 2. As shown in FIG. 7A, there are four pixel blocks in short wavelength sensor array 105 per each pixel region in long wavelength sensor array 101 (for a total of 16 pixel blocks shown in short wavelength sensor array 105 and four pixel regions shown in long wavelength sensor array 101), which is a double pitch.

As a further illustrative example, a case is described in which the pixel array of the long wavelength sensor array 101 has a cycle that is twice the cycle of the pixel array in the short wavelength sensor array 105, as illustrated in FIG. 7A. In this example, because the lines can cause shading due to blocking light transmittance, it may be preferable that 2 of the pixel lines of the right side and the left side and 2 of the pixel lines of the upper side and the lower side are located as in FIG. 7A in the 2×2 pixels of the short wavelength sensor array 105, in order to avoid shading of the light to the pixel of the long wavelength sensor array 101 by the lines of the pixels of the short wavelength sensor array 105. Thereby, the shading of the pixels of the long wavelength sensor array 101 advantageously decreases. Also, when m and n are equal to or larger than 3, boundaries between the pixels are aligned as much as possible, as shown in the case of the cycle of 3 times illustrated in FIG. 7B for example, and two or more lines are located at the boundaries of the pixels. Thereby, the shading performance to the pixels of the long wavelength sensor array 101 can be reduced.

Also, as illustratively shown in FIGS. 8A and 8B, a pixel line layer 121 for the lines of the long wavelength sensor array 101 may be provided below the long wavelength sensor array 101, and a pixel line layer 123 for the lines of the short wavelength sensor array 105 may be provided below the short wavelength sensor array 105. As shown, a plurality of lines 125 are provided according to the pixel locations of the long wavelength sensor array 101 and the short wavelength sensor array 105, and these plurality of lines 125 are provided in the inner portion of these pixel line layers 121, 123 (e.g., within the inner portion of the pixel line layers 121, 123). To extract a signal from a pixel line layer of interest, a penetrated connection hole may be formed in the image sensor 10 to extract the signal using a metallic pad provided in the bottom portion of the penetrated connection hole.

When the drive voltage of the long wavelength sensor array 101 and the drive voltage of the short wavelength sensor array 105 differ from each other, it may be preferable to provide each of the penetrated connection holes 127 for extracting the signal from the long wavelength sensor array 101 separately from each of the penetrated connection holes 129 for extracting the signal from the short wavelength sensor array 105, as illustrated in FIG. 8A. Additionally, long wavelength sensor array dedicated pads 131 may be provided at bottom portions of the penetrated connection holes 127, and short wavelength sensor array dedicated pads 133 may be provided at bottom portions of the penetrated connection holes 129.

On the other hand, when the drive voltage of the long wavelength sensor array 101 and the drive voltage of the short wavelength sensor array 105 are the same, the penetrated connection holes for extracting the signal from the long wavelength sensor array 101 and the penetrated connection holes for extracting the signal from the short wavelength sensor array 105 are in common (e.g., the penetrated connection holes for extracting the signal from the long wavelength sensor array 101 are the same as the penetrated connection holes for extracting the signal from the short wavelength sensor array 105), and pads 137 are provided at the bottom portions of these common penetrated connection holes 135, as illustrated in FIG. 8B.

Also, as illustrated in FIG. 9, in the image sensor 10 according to the present embodiment, a semiconductor layer 151 that includes at least one of a logic circuit and a memory circuit may be additionally provided under the long wavelength sensor array 101. In various embodiments, it may be important that the long wavelength sensor array 101 and the short wavelength sensor array 105 are not connected electrically in the image sensor 10, and thus the electrical connection of the long wavelength sensor array 101 to the semiconductor layer 151 is electrically separate from the electrical connection of the short wavelength sensor array 105 to the semiconductor layer 151. By additionally stacking this semiconductor layer 151 on the long wavelength sensor array 101 and the short wavelength sensor array 105, more complicated signal processing can be performed directly under the sensor arrays, and signal processing in the image sensor 10 can be performed at a higher speed.

Thus, the overall structure of the image sensor 10 according to the present embodiment has been described in detail with reference to FIGS. 1 to 9.

<With Regard to Production Methods of Image Sensor>

Next, the production method of the image sensor 10 according to the present embodiment described above will be described simply with reference to FIG. 10.

Figure 10:
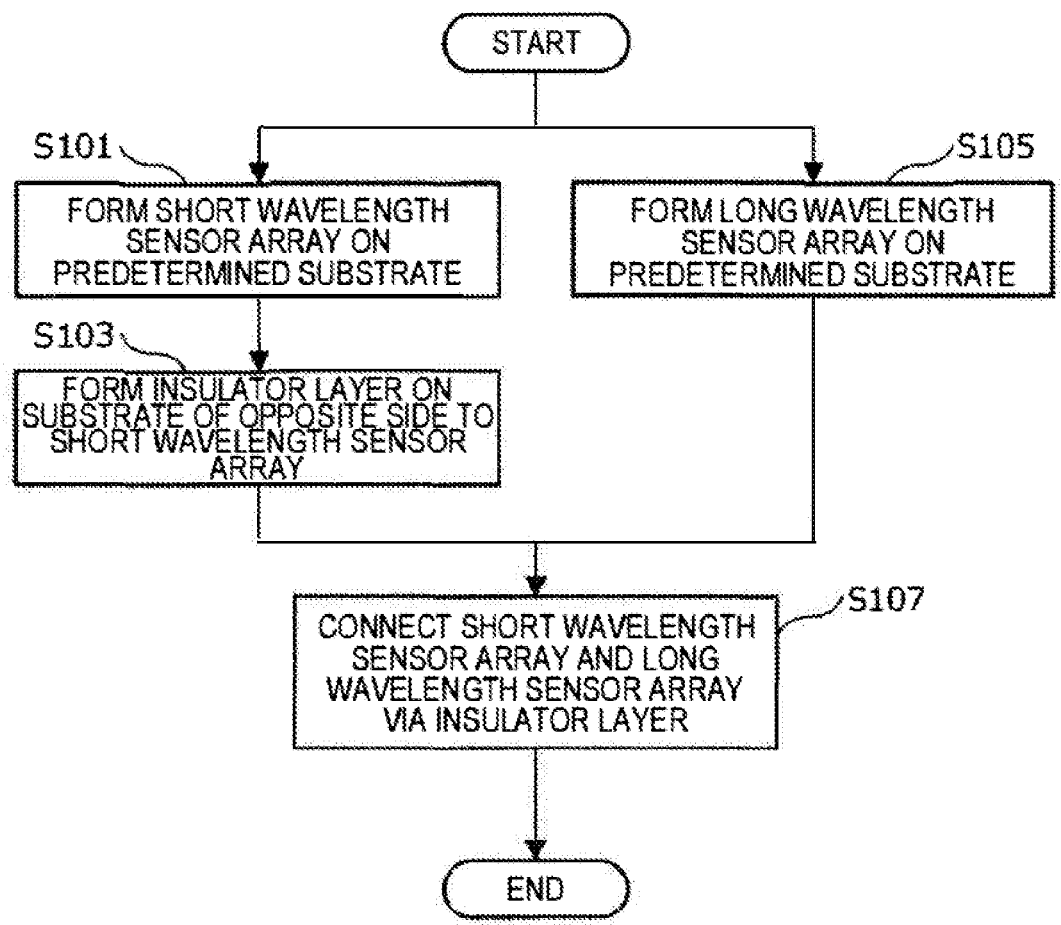
FIG. 10 is a flow diagram that illustratively shows an example of flow of a production method of an image sensor according to this embodiment.

FIG. 10 is a flow diagram that illustrates an example of the production method of the image sensor 10 according to the present embodiment.

The production method of the image sensor 10 according to the present embodiment includes forming the short wavelength sensor array composed of a plurality of pixels that receive the light of the relatively short wavelength side from the light of a predetermined wavelength band, on a predetermined substrate; forming the long wavelength sensor array composed of a plurality of pixels that receive the light of the relatively long wavelength side from the light of the predetermined wavelength band, on the predetermined substrate; providing the short wavelength sensor array on one side of the insulator that reflects the light of the short wavelength side and allows the light of the long wavelength side to transmit through the insulator; and locating the long wavelength sensor array on another side of the insulator.

As illustratively shown in in FIG. 10, for example, the short wavelength sensor array 105 described previously is formed on a predetermined substrate, by utilizing a production process (step S101). Thereafter, the insulator layer 103 is formed on the substrate of the opposite side to the side where the short wavelength sensor array 105 is formed, by utilizing the production process (step S103).

On the other hand, the long wavelength sensor array 101 described previously is formed on the predetermined substrate, by utilizing the production process (step S105).

Thereafter, the short wavelength sensor array 105 and the long wavelength sensor array 101 are connected via the insulator layer 103 (step S107). Thereby, the image sensor 10 according to the present embodiment can be produced.

Note that FIG. 10 illustrates a case in which the insulator layer 103 is formed on the back surface of the substrate for forming the short wavelength sensor array 105; however, the insulator layer 103 may be formed on the back surface of the substrate for forming the long wavelength sensor array 101.

In the description above, the production method of the image sensor 10 according to the present embodiment has been described simply with regard to FIG. 10. Note that a more specific production method of the image sensor 10 according to the present embodiment will be described again below with reference to a further specific example.

<With Regard to Image Capturing Systems>

Figure 11:
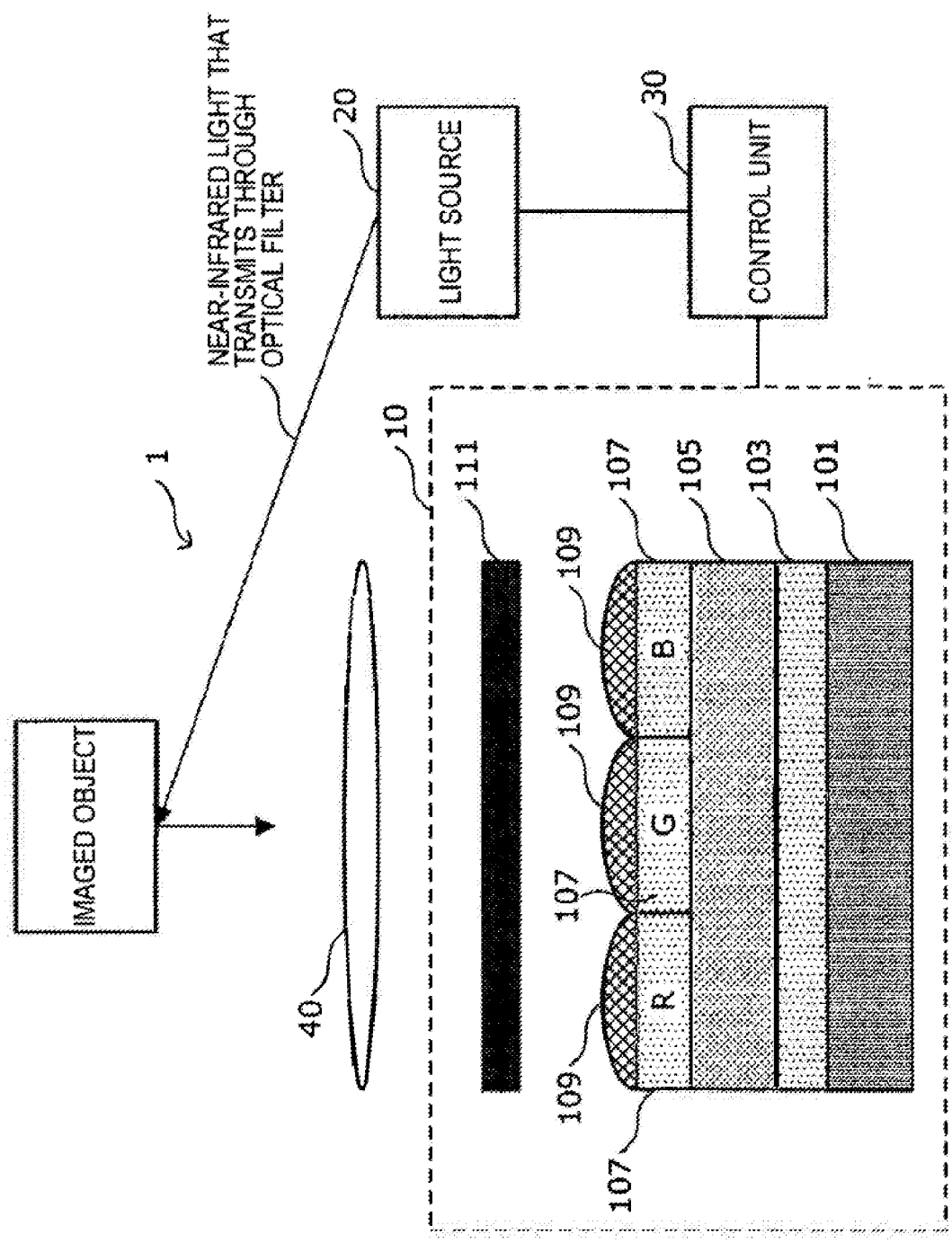
FIG. 11 is an illustrative diagram that schematically shows an overall structure of an image capturing system according to this embodiment.
Figure 12:
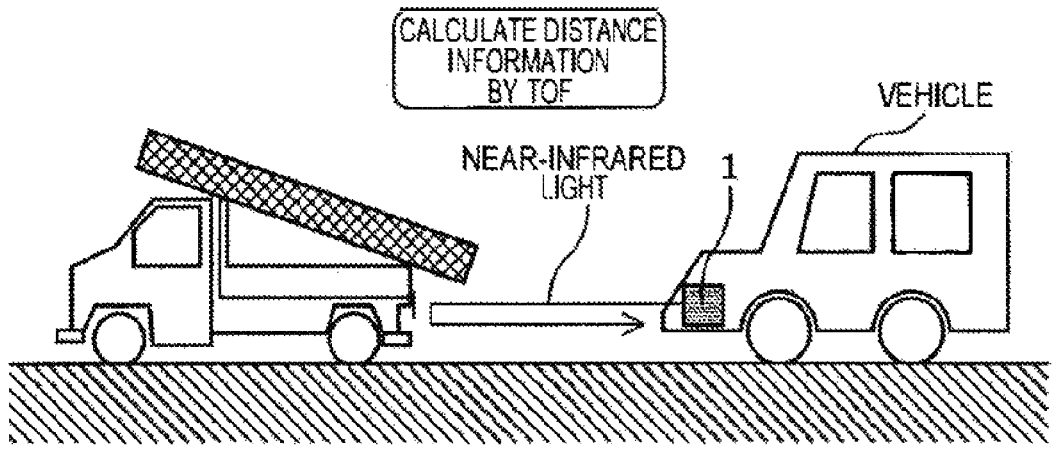
FIG. 12 is an illustrative diagram for describing an image capturing system according to this embodiment.
Figure 13:
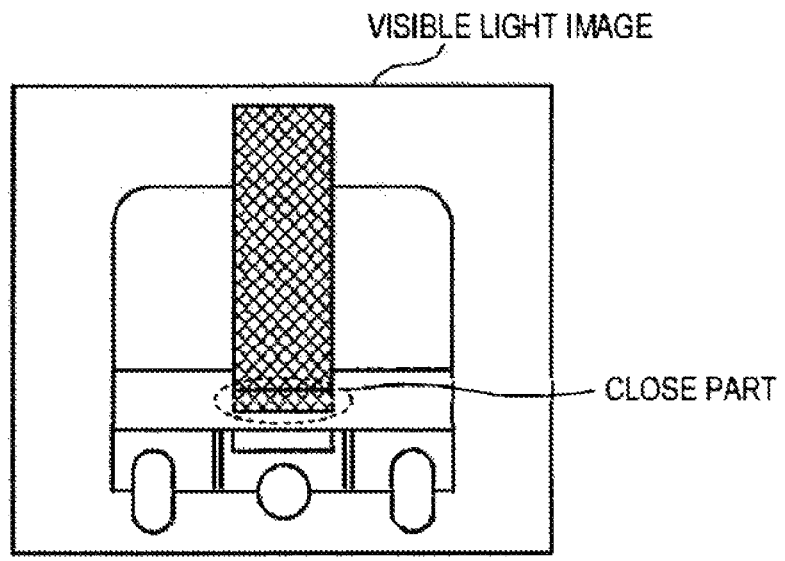
FIG. 13 is an illustrative diagram for describing an image capturing system according to this embodiment.
Figure 14:
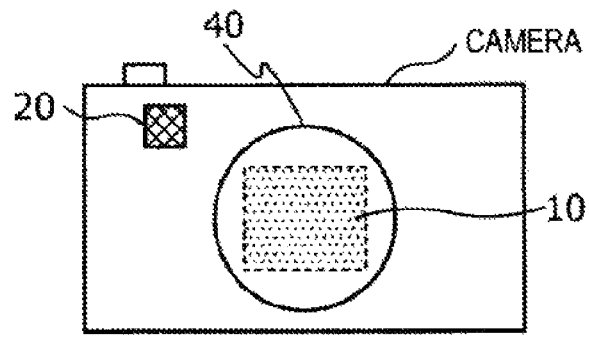
FIG. 14 is an illustrative diagram for describing an image capturing system according to this embodiment.

Next, an image capturing system that utilizes the image sensor 10 according to the present embodiment will be described with reference to FIGS. 11 to 14. FIG. 11 is an explanatory diagram that schematically illustrates an overall structure of the image capturing system according to the present embodiment. FIGS. 12 to 14 are explanatory diagrams for describing the image capturing system according to the present embodiment.

The image capturing system 1 according to the present embodiment includes an image sensor 10 that includes an optical filter 111, a light source 20, and a control unit 30, as schematically illustrated in FIG. 11. Also, the image capturing system 1 according to the present embodiment may further include an optical system 40 composed of one or a plurality of optical elements, as desired.

In various embodiments, it may be preferable that the image sensor 10 used in the image capturing system 1 according to the present embodiment is the image sensor 10 that includes the optical filter 111, as illustrated in FIG. 11. The following description is made using an example of a case in which the image sensor 10 includes the long wavelength sensor array 101 that functions as the infrared light sensor array, and the short wavelength sensor array 105 that functions as the visible light sensor array.

The light source 20 emits, toward an imaged object, the light (the near-infrared light, in the present example) of the wavelength band that transmits through the optical filter 111 provided in the image sensor 10. The light source 20 is not limited and can be any light source that emits the light of a desired wavelength band. Various types of light-emitting diodes (LED) and various types of laser light sources can be utilized as the light source 20, for example.

For example, the short wavelength sensor array 105 of the image sensor 10 may be formed of a photoelectric conversion material that includes Si, and set in such a manner that the near-infrared light band that transmits through the optical filter 111 is included in the wavelength band that is absorbed by Si. In this case, an LED or a laser light source that utilize AlGaAs-based semiconductor can be used as the light source 20, for example.

Also, the short wavelength sensor array 105 of the image sensor 10 may be formed of a photoelectric conversion material that includes Si, and set in such a manner that the near-infrared light band that transmits through the optical filter 111 does not include the wavelength band that is absorbed by Si. In this case, an LED or a laser light source that utilizes a InGaAs-based semiconductor can be used as the light source 20, for example.

The light source 20 according to the present embodiment may continuously emit the light of the above wavelength, but it may be preferable that the light source 20 can emit pulse light of the above wavelength. By using a light source 20 that is capable of a pulse drive, this enables distance measurements based on the principle of time of flight (TOF). TOF measures the distance to the imaged object by utilizing a delay time $\Delta t$ during which the pulse light is emitted, reflected on an imaged object, and returned. The distance measuring method based on the principle of TOF will be described again below.

The control unit 30 is configured with various types of electricity circuits (also referred to as circuits herein), or various types of IC chips or the like configured with a central processing unit (CPU), a read only memory (ROM), a random access memory (RAM), or other type of memory, or a digital signal processor (DSP) or other type of processor, for example. This control unit 30 is a processing unit that controls an overall drive state of the image sensor 10 and the light source 20 according to the present embodiment. For example, the control unit 30 outputs a control signal for emitting the light of a predetermined wavelength to the light source 20, and emits the light of the predetermined wavelength from the light source 20 at a predetermined timing. Also, the control unit 30 controls the drive state of the image sensor 10, and acquires signal data output from the long wavelength sensor array 101 of the image sensor 10 and signal data output from the short wavelength sensor array 105. In addition, various types of signal processing can be performed on the acquired signal data.

Also, the control unit 30 can perform the distance measurement process based on the principle of TOF, by driving the light source 20 with pulses. In this case, the control unit 30 outputs a control signal for emitting a pulse light to the light source 20, and starts the measurement of the delay time $\Delta t$. Thereafter, the control unit 30 waits until the signal data that is generated by detecting the pulse light is output from the long wavelength sensor array 101 of the image sensor 10. The time from outputting the control signal for emitting the pulse light to outputting the signal data from the long wavelength sensor array 101 is the delay time $\Delta t$. Now, a relationship $L=(\frac{1}{2})\times c\times\Delta t$ is established, where L is the distance to the imaged object (distance to be measured), and c is the light speed. Thus, the control unit 30 can calculate the distance L to the imaged object, by utilizing the obtained delay time $\Delta t$ and the light speed c.

Thus, the image capturing system 1 according to the present embodiment can calculate distance information (information relevant to the value of the distance L) based on the principle of TOF, for each pixel of the long wavelength sensor array 101, in consideration of which position the pixel that outputs the signal data exists in the long wavelength sensor array 101. Thus, a two-dimensional map of the distance information can be generated by calculating the distance information for all pixels included in the long wavelength sensor array 101.

Also, in the past technology, the image information and the distance information were acquired by different optical systems, and thus the image information and the distance information were unable to be aligned accurately; however, in the image sensor 10 according to the present embodiment, the long wavelength sensor array 101 and the short wavelength sensor array 105 exist in a vertically stacked state, and thus the image (for example, the visible light image) generated by the short wavelength sensor array 105 and the distance information can be aligned more easily and accurately than when using the past technology.

Note that, when the distance measurement by TOF is performed by using the image capturing system 1 according to the present embodiment, it may be preferable that the long wavelength sensor array 101 that functions as the infrared light sensor array has high sensitivity by utilizing a carrier multiplication sensor such as an APD or an SPAD, so that the distance measurement can be performed even when the distance to the imaged object is a long distance. The reason for this is that, for example, the drive voltage is high when the APD and the SPAD are used, but the long wavelength sensor array 101 and the short wavelength sensor array 105 are separated by the insulator layer 103, and therefore the image sensor 10 according to the present embodiment provides advantageous improvements to drive each sensor array separately with different voltages (e.g., the driving of the sensor arrays is faster, requires less processing, etc.).

The optical system 40 is provided as desired and/or necessary, to direct to the image sensor 10 the light that propagates from the imaged object side. This optical system 40 is not limited by the description herein, and an optical system that utilizes one or a plurality of optical elements such as lenses can be utilized.

In the description above, the configuration of the image capturing system 1 according to the present embodiment has been described with reference to FIG. 11.

A collision prevention system that utilizes the distance measurement based on the principle of TOF can be configured by applying the image capturing system 1, as described above, to a collision prevention onboard camera system provided in a vehicle as illustrated in FIG. 12, for example. The light source 20 of the image capturing system 1 is driven with pulses, and the distance information is calculated on the basis of the principle of TOF, and thereby the visible light image and the distance information can advantageously be aligned with greater accuracy. The image sensor 10 according to the present embodiment advantageously provides an easier (e.g., faster) identification of the position of the pixel that outputs the signal data that is used to calculate the distance information, in the long wavelength sensor array 101. Also, the image sensor 10 according to the present embodiment advantageously provides an easier (e.g., faster) identification of the relationship between the position of the pixels that compose the long wavelength sensor array 101 and the pixels that compose the short wavelength sensor array 105. Thus, as schematically illustrated in FIG. 13, it can be easily recognized what the closest position of the vehicle is that is traveling forward, as well as what the value of the distance measurement is.

Note that, when the collision prevention system is configured as described herein (e.g., in a simpler and more convenient manner), the distance information does not need to be calculated for every one of the pixels that compose the long wavelength sensor array 101. For example, the site that is closest in the visible light image may be identified by identifying the pixel position in the long wavelength sensor array 101 that provides the shortest delay time $\Delta t_{min}$, and by identifying the pixel of the short wavelength sensor array 105 that corresponds to the pixel position that was identified.

Also, as illustrated in FIG. 14, for example, the image capturing system 1 described herein can be applied to an automatic focusing mechanism such as a camera or other automatic focusing mechanism. In a camera or other automatic focusing mechanism, the sensor for generating the visible light image is located in a physically separate position from the sensor for performing the distance measurement, and thus the visible light image and the distance information are unable to be aligned accurately. This results in a possibility that misalignments of the focal point of the subject may be generated. However, by utilizing the image capturing system according to the present embodiment, the distance information can be more accurately aligned with the visible light image, and thus the focal point can be set easily (e.g., quickly and accurately) on the subject by specifying the position that is targeted as the subject.

Note that FIG. 14 illustrates a camera as an example, but the image capturing device that can employ the image capturing system 1 according to the present embodiment is not limited to the camera, and the image capturing device can be applied to various types of devices that has an image capturing function, such as a mobile phone, a smartphone, and various types of tablet terminals, among others.

In the above, the image capturing system 1 that utilizes the image sensor 10 according to the present embodiment has been described in detail, with reference to FIGS. 11 to 14.

<With Regard to Specific Examples of Image Sensor>

In the following description, the image sensor 10 according to the present embodiment will be described with reference to FIGS. 15 to 23. Note that a specific example of the image sensor described below is just an illustrative example of the image sensor according to one of the embodiments of the present disclosure, and the image sensors according to the embodiments of the present disclosure are not limited to any example or specific example described herein.

First Specific Example

Figure 15:
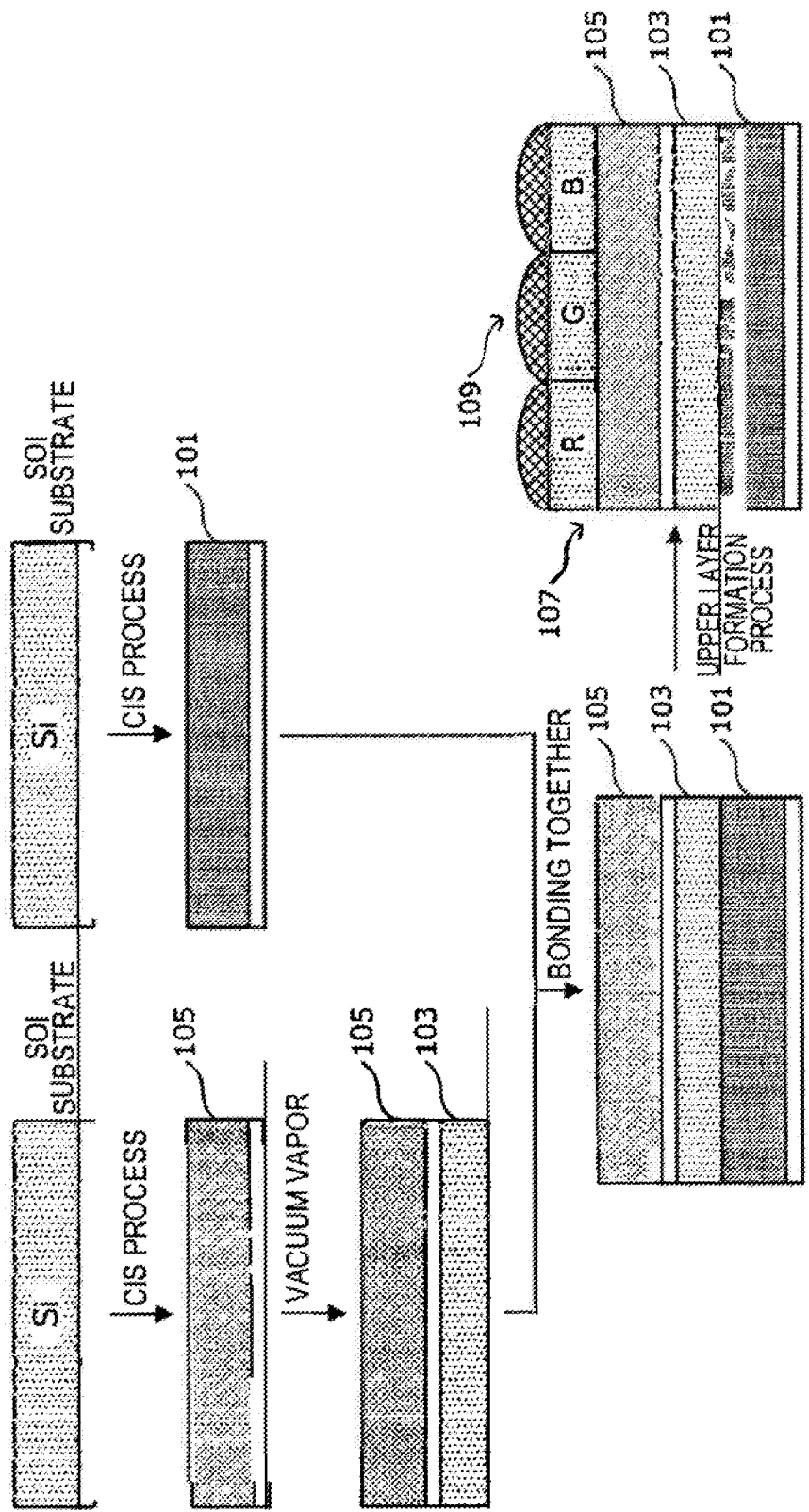
FIG. 15 is an illustrative diagram for describing a first specific example of an image sensor according to this embodiment.
Figure 16:
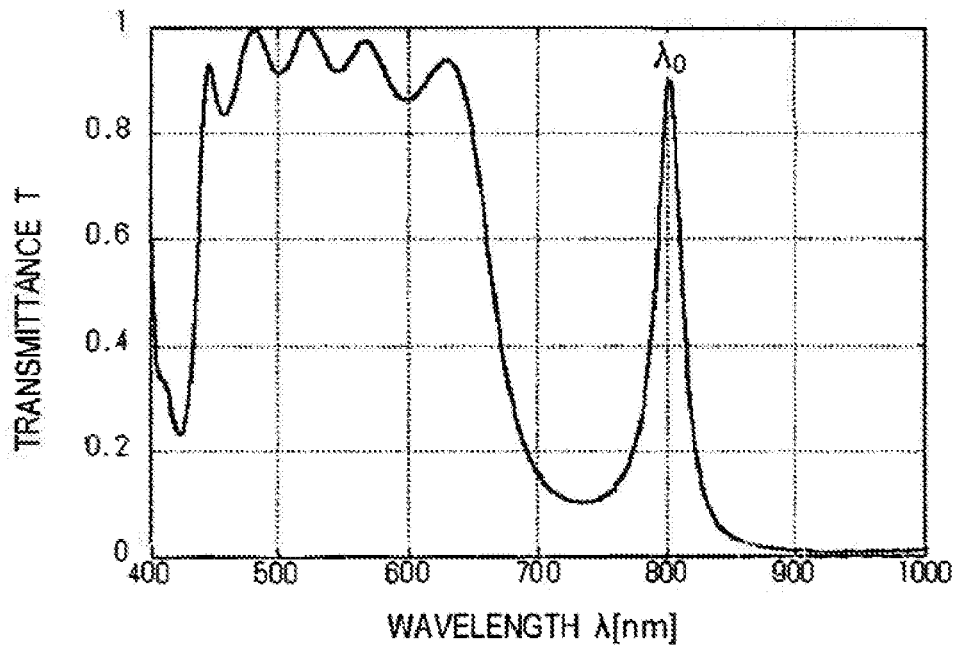
FIG. 16 is a graph diagram that illustratively shows transmission characteristics of an optical filter in a first specific example of an image sensor.
Figure 17:
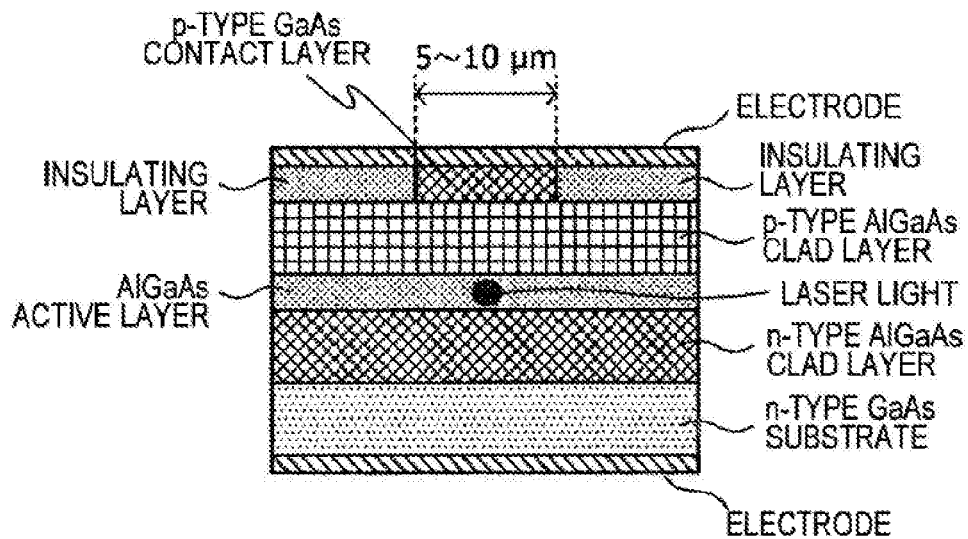
FIG. 17 is an illustrative diagram that schematically shows a structure of a light source that is applicable to a first specific example of an image sensor.

A first specific example of the image sensor according to the present embodiment will be described with reference to FIGS. 15 to 17. FIG. 15 is an explanatory diagram for describing the first specific example of the image sensor according to the present embodiment. FIG. 16 is a graph diagram that illustrates transmission characteristics of an optical filter in the first specific example of the image sensor. FIG. 17 is an explanatory diagram that schematically illustrates the structure of a light source that is applicable to the first specific example of the image sensor.

The present specific example shows an image sensor that has the structure as illustrated on the right side of FIG. 15. A light collection structural element (e.g., an OCL) 109 is positioned at the uppermost portion (e.g., a portion closest to a light-receiving side) of the image sensor 10. Also, an on chip color filter (OCCF) such as a color filter for RGB pixels is provided as the visible light wavelength selection filter 107 under the light collection structural element 109. In the present specific example, the Bayer array illustrated in FIG. 3A is employed as the array of the visible light wavelength selection filter 107. The short wavelength sensor array 105 that functions as the visible light sensor array, which is produced by using a Si substrate, is positioned under the visible light wavelength selection filter 107. The insulator layer 103 composed of the insulator multilayer film is positioned under the short wavelength sensor array 105, and the long wavelength sensor array 101 that functions as the infrared light sensor array is positioned under the insulator layer 103.

The insulator layer 103 in the present specific example is formed with a $SiO_2$ film, a $Si_3N_4$ film, and a $TiO_2$ film, as illustrated in FIG. 4A. That is, each film of a $Si_3N_4$ film, a $TiO_2$ film, a $SiO_2$ film, a $TiO_2$ film, a $SiO_2$ film, a $TiO_2$ film, a $SiO_2$ film, a $TiO_2$ film, a $SiO_2$ film, a $TiO_2$ film, a $SiO_2$ film, a $TiO_2$ film, and a $Si_3N_4$ film are formed in this order, as the interference films, on the $SiO_2$ film that has a thickness equal to or larger than 1 μm. The thicknesses of respective films are 0.133 μm, 0.046 μm, 0.082 μm, 0.046 μm, 0.082 μm, 0.046 μm, 0.082 μm, 0.046 μm, 0.082 μm, 0.046 μm, 0.082 μm, 0.046 μm, and 0.133 μm. In addition, after the interference films are formed, a $SiO_2$ film of 1 μm or more is stacked. The reflection spectrum of the insulator layer 103 that is produced as described above is illustrated in FIG. 4B.

In a specific production procedure of the image sensor 10, a photo diode (PD) structure or the like that has a p-n junction is produced on a silicon-on-insulator (SOI) substrate at the Si side, by a CIS process (which is a production process of CMOS Image Sensor (CIS) that includes, for example, a resist mask process, an ion implantation process, an anneal process, an electrode wiring process, and/or other CIS processes) in order to form the short wavelength sensor array 105, as schematically illustrated in FIG. 15. Thereafter, the insulator layer 103 is formed on the back surface of the SOI substrate, by a vacuum vapor deposition method.

Also, the long wavelength sensor array 101 is produced on another SOI substrate by utilizing the CIS process, and the two sensor arrays are bonded together via the insulator layer 103. Then, a process for producing the visible light wavelength selection filter 107 and the light collection structural element 109 of the upper layer (hereinafter, referred to as "upper layer formation process") is performed.

The dopant that is utilized when forming the short wavelength sensor array 105 and the long wavelength sensor array 101 may include a p-type dopant, such as boron (B), indium (In), and/or other p-type dopants, and may include a n-type dopant, such as phosphorus (P), arsenic (As), antimony (Sb), bismuth (Bi), and/or other n-type dopants. Also, an APD that is capable of avalanche multiplication may be utilized as the long wavelength sensor array 101.

Next, the optical filter 111 that has optical characteristics illustrated in FIG. 6A is produced and provided at the prior stage (e.g., a light-receiving side) of the light collection structural element 109. In the optical filter 111 that functions as this infrared cut filter, a $Si_3N_4$ film, a $TiO_2$ film, a $SiO_2$ film, a $TiO_2$ film, a $SiO_2$ film, a $TiO_2$ film, a $SiO_2$ film, a $TiO_2$ film, a SiO₂ film, a TiO₂ film, a SiO₂ film, a TiO₂ film, and a Si₃N₄ film are formed in this order as the interference film on the glass substrate by utilizing the vacuum vapor deposition method. The thicknesses of the respective interference films are 0.073 µm, 0.103 µm, 0.187 µm, 0.083 µm, 0.150 µm, 0.083 µm, 0.52 µm, 0.083 µm, 0.150 µm, 0.083 µm, 0.150 µm, 0.083 µm, and 0.133 µm.

The transmission spectrum of the optical filter 111 that is produced as described above is illustrated in FIG. 16. In FIG. 16, the horizontal axis is wavelength, and the vertical axis is transmittance T. As can be seen in FIG. 16, the visible light that has a wavelength equal to or smaller than 650 nm and the infrared light that has a wavelength of 800 nm (with a half width wavelength approximately 20 nm) are transmitted through the optical filter 111.

FIG. 17 illustrates a light source that can be used with this optical filter 111. The light source illustrated in FIG. 17 is an AlGaAs-based semiconductor laser that emits laser light at a wavelength of about 800 nm. This semiconductor laser is operated by a pulse drive, and the pulse light is projected to the imaged object in order to measure the delay time Δt. The distance information to the imaged object can thereby be calculated.

Note that the oscillation wavelength of the semiconductor laser illustrated in FIG. 17 can be adjusted as appropriate, by controlling the composition ratio of Al and Ga, which are group 3 elements that make up the AlGaAs active layer illustrated in FIG. 17. Also, in the present specific example, a case that uses the semiconductor laser as the light source 20 is described, but an AlGaAs-based LED can be utilized to measure the distance, and another material can be utilized if the light source emits the light or oscillates at the above wavelength.

Also, a lens (such as a collimator lens) may be located at the prior stage of the light source 20 (such as a semiconductor laser), to efficiently project the laser light or the LED light to the imaged object. The visible light image and the infrared light information can be simultaneously acquired by the same optical system, by using the image capturing system 1 composed of the image sensor 10 and the light source 20. It is thereby possible to obtain visible light image and the distance information that is accurately aligned to the visible light image. This image capturing system can be applied to the onboard collision prevention system, and can be applied to the automatic focusing mechanism of the camera, as described herein.

In the above, the first specific example of the image sensor 10 according to the present embodiment has been described in detail with reference to FIGS. 15 to 17.

Second Specific Example

Figure 18:
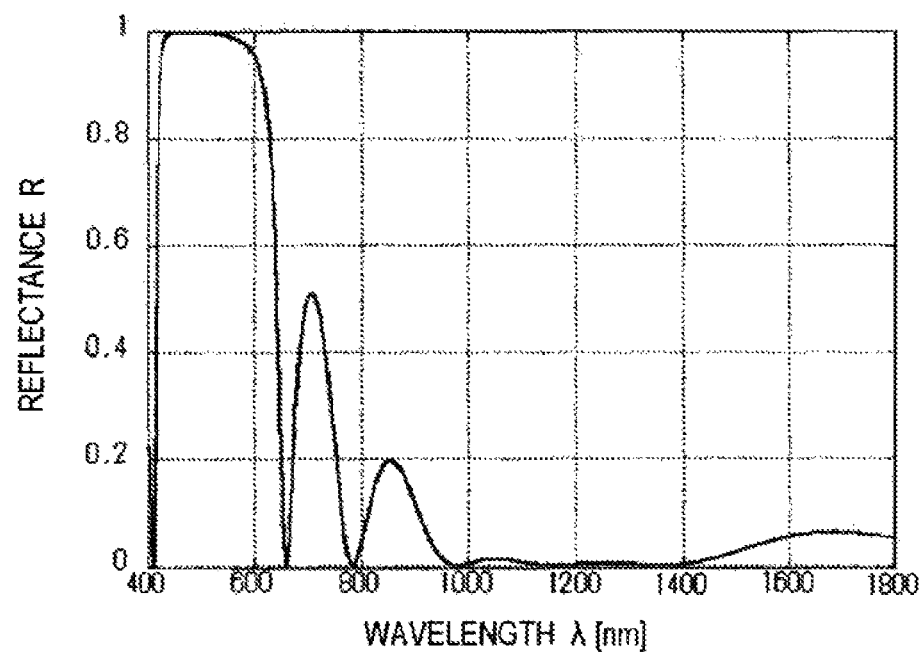
FIG. 18 is an illustrative graph diagram that shows reflection characteristics of an insulator layer in a second specific example of an image sensor according to this embodiment.
Figure 19:
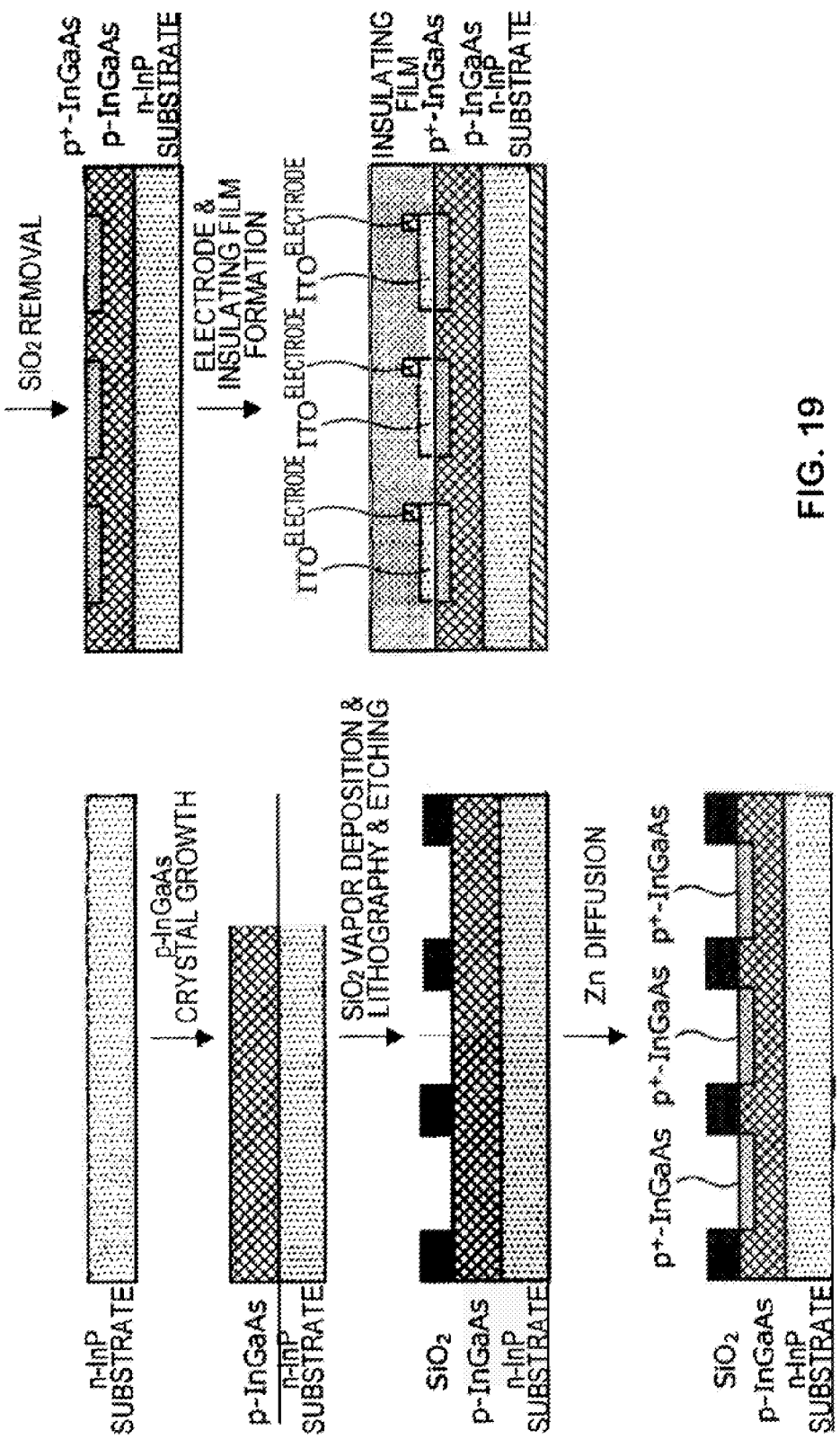
FIG. 19 is an illustrative diagram for describing a long wavelength sensor array in a second specific example of an image sensor.
Figure 20:
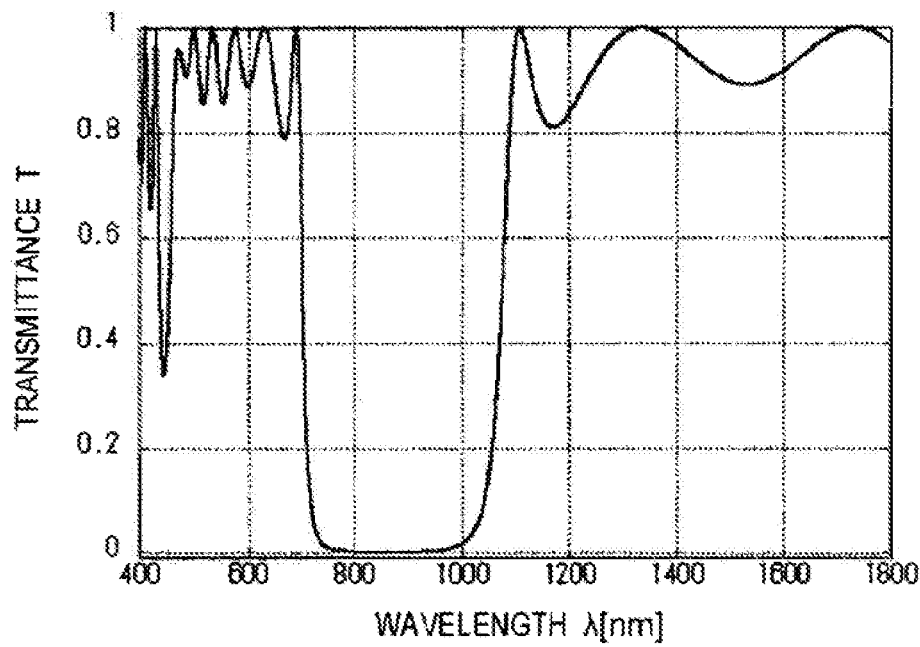
FIG. 20 is an illustrative graph diagram that shows transmission characteristics of an optical filter in a second specific example of an image sensor.
Figure 21:
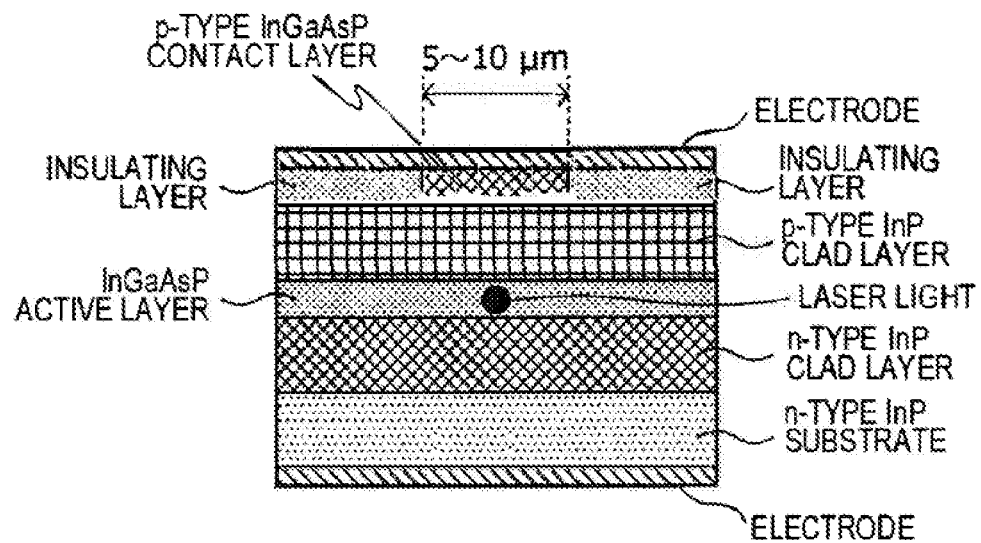
FIG. 21 is an illustrative diagram that schematically shows a structure of a light source that is applicable to a second specific example of an image sensor.

Next, a second specific example of the image sensor according to the present embodiment will be described with reference to FIGS. 18 to 21. FIG. 18 is a graph diagram that illustrates the reflection characteristics of the insulator layer in the second specific example of the image sensor according to the present embodiment. FIG. 19 is an explanatory diagram for describing the long wavelength sensor array in the second specific example of the image sensor. FIG. 20 is a graph diagram that illustrates the transmission characteristics of the optical filter in the second specific example of the image sensor. FIG. 21 is an explanatory diagram that schematically illustrates the structure of the light source that is applicable to the second specific example of the image sensor.

The present specific example relates to the image sensor 10 that utilizes the optical filter 111 that has the optical characteristics illustrated in FIG. 6B. The image sensor 10 according to the present specific example is the image sensor 10 that has the overall structure that is the same as the first specific example illustrated at the right side of FIG. 15.

In the present specific example, the insulator layer 103 is formed of a SiO₂ film, a Si₃N₄ film, and a TiO₂ film. That is, each layer of a Si₃N₄ film, a TiO₂ film, a SiO₂ film, a TiO₂ film, a SiO₂ film, a TiO₂ film, a SiO₂ film, a TiO₂ film, a SiO₂ film, a TiO₂ film, a SiO₂ film, a TiO₂ film, and a Si₃N₄ film are formed in this order, as the interference films, on the SiO₂ film that is 1 µm or more. The thicknesses of the respective films are 0.228 µm, 0.046 µm, 0.082 µm, 0.046 µm, 0.082 µm, 0.046 µm, 0.082 µm, 0.046 µm, 0.082 µm, 0.046 µm, 0.082 µm, 0.046 µm, and 0.228 µm. In addition, after the interference films are formed, a SiO₂ film of 1 µm or more is stacked. The reflection spectrum of the insulator layer 103 that is produced as described above is illustrated in FIG. 18.

In FIG. 18, the horizontal axis is wavelength, and the vertical axis is reflectance R. The insulator layer 103 that has the above structure not only reflects the visible light of wavelength 650 nm or less, but also allows the infrared light of wavelength 1.1 µm or more to transmit through the insulator layer 103, as is shown in FIG. 18.

With regard to a specific production procedure of the image sensor 10, the short wavelength sensor array 105 that functions as the visible light sensor array is produced by the CIS process by forming the PD structure (or a similar structure) having the p-n junction, on the SOI substrate at the Si side. Thereafter, the insulator layer 103 that has the structure described above is formed on the back surface (e.g., the surface furthest from the light-incident side) of the SOI substrate, by the vacuum vapor deposition method.

As shown in FIG. 19, the image sensor that uses a InGaAs material that has the sensitivity to wavelength 1.1 µm or more as the photoelectric conversion material, is produced separately as the long wavelength sensor array 101. First, the crystal of a p-InGaAs film is grown on a n-InP substrate by utilizing a metal organic chemical vapor deposition (MOCVD) method or a molecular beam epitaxy (MBE) method. An example of this is illustrated in FIG. 19. The p-InGaAs film functions as the PD by the p-n junction that is formed. Further, in order to form the p⁺ layer (p⁺-InGaAs layer) used to establish contact for each pixel in an isolated manner, a mask of SiO₂ or another mask material is formed by a lithography process, and a p-type dopant such as Zn is partially diffused into the p-InGaAs film. Thereafter, after removal of the SiO₂ mask, an electrode formation process that utilizes the indium-tin-oxide (ITO) is performed, and an insulating film is formed to cover the electrode. Thus, using this procedure, the long wavelength sensor array 101 that has sensitivity to a wavelength of 1.1 µm or more is produced.

After producing the long wavelength sensor array 101, the long wavelength sensor array 101 is bonded to the short wavelength sensor array 105 and the insulator layer 103, and then the upper layer formation process described in the first specific example is performed to produce the image sensor 10 according to the present specific example. Note that, in the present specific example, the APD that is capable of avalanche multiplication can be utilized instead of the long wavelength sensor array 101 that utilizes the InGaAs-based semiconductor.

Next, the optical filter 111 that has the optical characteristics as illustrated in FIG. 6B is produced and provided at a prior stage to the light collection structural element 109. This optical filter 111 that functions as the infrared cut filter utilizes a vacuum vapor deposition method, and a $Si_3N_4$ film, a $TiO_2$ film, a $SiO_2$ film, a $TiO_2$ film, a $SiO_2$ film, a $TiO_2$ film, a $SiO_2$ film, a $TiO_2$ film, a $SiO_2$ film, a $TiO_2$ film, a $SiO_2$ film, a $TiO_2$ film, a $SiO_2$ film, a $TiO_2$ film, and a $Si_3N_4$ film are formed in this order as the interference films on the glass substrate. The thicknesses of the respective interference films are 0.228 µm, 0.081 µm, 0.146 µm, 0.081 µm, 0.146 µm, 0.081 µm, 0.146 µm, 0.081 µm, 0.146 µm, 0.081 µm, 0.146 µm, 0.081 µm, 0.146 µm, 0.081 µm, and 0.228 µm.

The transmission spectrum of the optical filter 111 that is produced as described above is illustrated in FIG. 20. In FIG. 20, the horizontal axis is wavelength, and the vertical axis is transmittance T. As shown in FIG. 20, the visible light of wavelength 650 nm or less and the light having a wavelength range $\lambda_0$ of 1100 nm (1.1 µm) or more (which is part of the infrared light spectrum) are transmitted through the optical filter 111.

Also, the light source that is used with this optical filter 111 may be, for example, the one that is illustrated in FIG. 21. The light source illustrated in FIG. 21 is an InGaAs-based semiconductor laser that emits laser light at a wavelength of 1100 nm or more. This semiconductor laser is operated by a pulse drive, and the pulse light is projected to the imaged object in order to measure the delay time $\Delta t$. The distance information to the imaged object can thereby be calculated.

Note that the oscillation wavelength of the semiconductor laser as illustrated in FIG. 21 can be adjusted as desired, by controlling the composition ratio of the InGaAsP active layer. Also, although the present specific example describes a case that uses the semiconductor laser as the light source 20, an InGaAs-based LED can be utilized to measure the distance, and another material can be utilized if the light source emits light or oscillates at the above wavelength.

Also, a lens (such as a collimator lens) may be located at a prior stage to the light source 20 (such as a semiconductor laser), in order to efficiently project the laser light or the LED light to the imaged object. In the present specific example, light having a wavelength of 1.1 µm or more is utilized, and thus the retina is unlikely to be damaged even if the light is projected on the retina of a person. Thereby, an eye-safe system can be built. By using the image capturing system 1 composed of the above image sensor 10 and the light source 20, the visible light image and the infrared light information can be simultaneously acquired by the same optical system, and thereby it is possible to obtain the visible light image and the distance information that are accurately aligned to the visible light image. This image capturing system can advantageously be applied to the onboard collision prevention system, and also can be advantageously applied to the automatic focusing mechanism of the camera, as described herein.

In the above, the second specific example of the image sensor 10 according to the present embodiment has been described in detail with reference to FIGS. 18 to 21.

Third Specific Example

Figure 22:
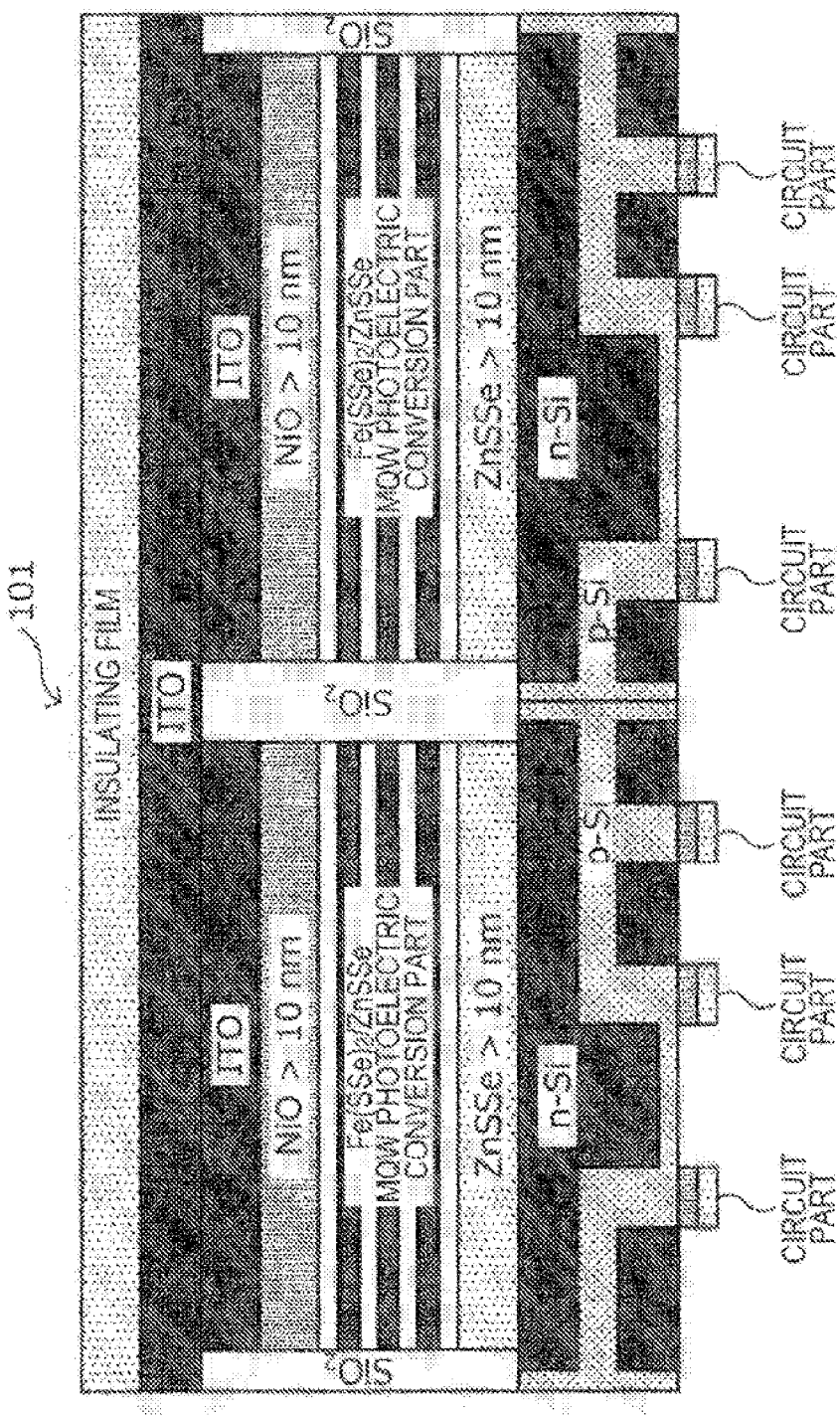
FIG. 22 is an illustrative diagram for describing a long wavelength sensor array in a third specific example of an image sensor according to this embodiment.

Next, a third specific example of the image sensor according to the present embodiment will be described with reference to FIG. 22. FIG. 22 is an explanatory diagram for describing the long wavelength sensor array in the third specific example of the image sensor according to the present embodiment.

In the present specific example, the InGaAs-based long wavelength sensor array 101 illustrated in the second specific example is replaced by a FeS-based (FeSSe-based) sensor array as illustrated in FIG. 22. The detailed structure of the FeS-based (FeSSe-based) sensor array is not limited to the example illustrated in FIG. 22, and a production process (for example, a production process as disclosed in JP 2015-119067A) can be applied to the production process of the sensor array.

The image sensor 10 that utilizes the long wavelength sensor array 101 illustrated in FIG. 22 can be formed on the Si substrate, and thus the image sensor 10 can be produced on a wafer that is larger than the InP substrate. Thus, the image sensor 10 according to the present specific example can advantageously be superior regarding its mass production, and also it is advantageously possible to achieve cost reduction.

In the above, the third specific example of the image sensor 10 according to the present embodiment has been described with reference to FIG. 22.

Fourth Specific Example

Figure 23:
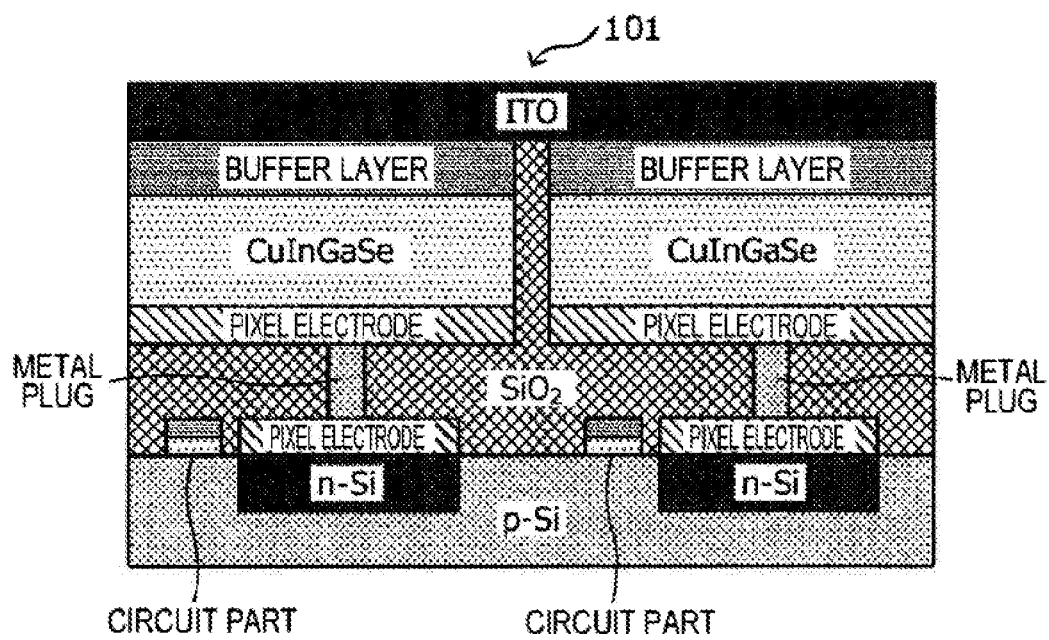
FIG. 23 is an illustrative diagram for describing a long wavelength sensor array in a fourth specific example of an image sensor according to this embodiment.

Next, a fourth specific example of the image sensor according to the present embodiment will be described with reference to FIG. 23. FIG. 23 is an explanatory diagram for describing the long wavelength sensor array in the fourth specific example of the image sensor according to the present embodiment.

In the present specific example, the long wavelength sensor array 101 of the InGaAs system as illustrated in the second specific example is replaced by a CuInGaSe-based sensor array as illustrated in FIG. 23. The detailed structure of the CuInGaSe-based sensor array is not limited to the example illustrated in FIG. 23, and various production processes can be applied to the production process of the sensor array.

The image sensor 10 that utilizes the long wavelength sensor array 101 as illustrated in FIG. 23 can be formed on the Si substrate, and thus the image sensor 10 can advantageously be produced on a wafer that is larger than the InP substrate. Thus, the image sensor 10 according to the present specific example can advantageously be superior in mass production, and also it is advantageously possible to achieve cost reduction.

In the above, the fourth specific example of the image sensor 10 according to the present embodiment has been described with reference to FIG. 23.

In the above, the specific examples of the image sensor 10 according to the present embodiment have been described in detail with reference to FIGS. 15 to 23.

As described above, in the image sensor 10 according to the present embodiment, the short wavelength sensor array 105 and the long wavelength sensor array 101 are electrically separated and stacked, and thereby the light of the long wavelength side can advantageously be imaged without creating defective pixels in the short wavelength sensor array 105. Also, in the image sensor 10 according to the present embodiment, the short wavelength sensor array 105 and the long wavelength sensor array 101 are electrically separated and stacked, and thereby the circuit driven with low voltage and the circuit driven with high voltage can advantageously be separated easily (e.g., more efficiently and quickly than when using past technology).

Further, the image sensor 10 according to the present embodiment can prevent the light of the short wavelength side from reaching the long wavelength sensor array 101 by providing the insulator layer 103, and thus can advantageously prevent the mixed color in the long wavelength sensor array 101. Also, utilization of the optical filter 111 can advantageously further reduce the mixed color of the light of the long wavelength side into the short wavelength sensor array 105, and improve the color reproducibility.

Also, both the visible light image and the distance information can be acquired by using the image capturing system 1 that uses the image sensor 10 according to the present embodiment, and the distance information can be associated with the visible light image easily (e.g., quickly) and accurately.

It should be understood by those skilled in the art that various modifications, combinations, sub-combinations and alterations are possible depending on design requirements and other factors insofar as they are within the scope of this disclosure or equivalents thereof.

Further, the effects described in this specification are merely illustrative or exemplified effects, and are not limitative. That is, with or in the place of the above effects, the technology according to the present disclosure may achieve other effects based on the description of this specification.

Additionally, the present technology may also be configured as below.

(A1)
An image sensor including a light receiving unit that includes
a long wavelength sensor array composed of a plurality of pixels that receive light of
a long wavelength side among light of a predetermined wavelength band,
an insulator layer that is positioned on the long wavelength sensor array, and reflects light of a short wavelength side among the light of the predetermined wavelength band, and allows the light of the long wavelength side to transmit through the insulator layer, and
a short wavelength sensor array positioned on the insulator layer and composed of a plurality of pixels that receive the light of the short wavelength side.

(A2)
The image sensor according to (A1), wherein
the light of the long wavelength side is light of an infrared light band, and
the light of the short wavelength side is light of a visible light band.

(A3)
The image sensor according to (A1) or (A2), further including
an optical filter that is positioned at a prior stage of the light receiving unit and allows light of a part of a wavelength band among the light of the long wavelength side to transmit through the optical filter.

(A4)
The image sensor according to (A2) or (A3), wherein
the insulator layer is made of an insulator multilayer film that reflects the light of the visible light band and allows the light of the infrared light band to transmit through the insulator multilayer film.

(A5)
The image sensor according to any one of (A1) to (A4), wherein
a drive voltage of the long wavelength sensor array is the same as a drive voltage of the short wavelength sensor array, and
each of the long wavelength sensor array and the short wavelength sensor array is wired via a common penetrated connection hole.

(A6)
The image sensor according to any one of (A1) to (A4), wherein
a drive voltage of the long wavelength sensor array and a drive voltage of the short wavelength sensor array are different from each other, and
each of the long wavelength sensor array and the short wavelength sensor array is wired via a different penetrated connection hole.

(A7)
The image sensor according to any one of (A1) to (A6), further including
a semiconductor layer that is positioned under the long wavelength sensor array, and includes at least one of a logic circuit and a memory circuit,
wherein the long wavelength sensor array and the short wavelength sensor array are electrically connected to the semiconductor layer separately.

(A8)
The image sensor according to any one of (A1) to (A3), wherein
the long wavelength sensor array detects light of an infrared light band of wavelength 1.1 µm or more, and
the optical filter is a filter that transmits light of a visible light band, and light of an infrared light band of wavelength 1.1 µm or more.

(A9)
The image sensor according to any one of (A1) to (A8), wherein
the long wavelength sensor array is a carrier multiplication sensor array.

(A10)
The image sensor according to any one of (A1) to (A9), wherein
a photoelectric conversion material in the long wavelength sensor array and a photoelectric conversion material in the short wavelength sensor array are different from each other.

(A11)
The image sensor according to (A10), wherein
the photoelectric conversion material of the short wavelength sensor array includes at least Si, and
the photoelectric conversion material of the long wavelength sensor array includes at least InGaAs, $FeS_2$, CuInGaSe, or Si.

(A12)
The image sensor according to any one of (A1) to (A11), wherein
a repetition pitch of the pixels in the long wavelength sensor array is an integer multiple of a repetition pitch of the pixels in the short wavelength sensor array.

(A13)
An image capturing system including:
an image sensor including
a light receiving unit that includes a long wavelength sensor array composed of a plurality of pixels that receive light of a long wavelength side among light of a predetermined wavelength band, an insulator layer that is positioned on the long wavelength sensor array, and reflects light of a short wavelength side among the light of the predetermined wavelength band, and allows the light of the long wavelength side to transmit through the insulator layer, and a short wavelength sensor array positioned on the insulator layer and composed of a plurality of pixels that receive the light of the short wavelength side, and
an optical filter that is positioned at a prior stage of the light receiving unit, and allows light of a part of a wavelength band among the light of the long wavelength side to transmit through the optical filter; and a light source that emits light of a wavelength band that transmits through the optical filter.

(A14)

The image capturing system according to (A13), further including a control unit that controls each of the image sensor and the light source, wherein the control unit calculates a distance to an imaged object, on a basis of a delay time that is generated due to light that is emitted from the light source and travels to and returns from the imaged object.

(A15)

The image capturing system according to (A14), wherein the control unit outputs a captured image generated by the short wavelength sensor array and distance information relevant to the calculated distance to the imaged object, in association with each other.

(A16)

The image capturing system according to (A14) or (A15), wherein the image capturing system is used in a collision prevention onboard camera system.

(A17)

The image capturing system according to (A14) or (A15), wherein the image capturing system is used in an automatic focusing mechanism.

(A18)

A production method of an image sensor, including:

forming a short wavelength sensor array composed of a plurality of pixels that receive light of a short wavelength side among light of a predetermined wavelength band, on a predetermined substrate;

forming a long wavelength sensor array composed of a plurality of pixels that receive light of a long wavelength side among the light of the predetermined wavelength band, on the predetermined substrate; and providing the short wavelength sensor array at one side of an insulator that reflects the light of the short wavelength side and allows the light of the long wavelength side to transmit through the insulator, and locating the long wavelength sensor array at another side of the insulator.

(B1)

An automotive vehicle, including:

an electronic apparatus including:

an imaging device, including:

a first substrate including a first set of photoelectric conversion units;

a second substrate including a second set of photoelectric conversion units; and an insulating layer between the first substrate and the second substrate;

where the insulating layer has a capability to reflect a first wavelength range of light and transmit a second wavelength range of light that is longer than the first wavelength range of light.

(B2)

The automotive vehicle according to (B1), further including:

an optical system that directs light propagating from an imaged object to the imaging device.

(B3)

The automotive vehicle according to according to one or more of (B1) to (B2), further including:

a control unit that controls an overall drive state of the imaging device.

(B4)

The automotive vehicle according to according to one or more of (B1) to (B3), further including:

a light source; and an optical filter, where the light source emits light that transmits through the optical filter towards an imaged object.

(B5)

The automotive vehicle according to according to one or more of (B1) to (B4), where the control unit calculates a distance measurement to the imaged object by outputting a control signal for emitting a pulse light to the light source to measure a delay time, where the delay time is measured from the outputting of the control signal to outputting of signal data from the second set of photoelectric conversion units from a reflected amount of infrared light received at the second set of photoelectric conversion units from the imaged object, and where the control unit calculates the distance using the delay time and a light speed.

(B6)

An electronic apparatus, including:

an imaging device, including:

a first substrate including a first set of photoelectric conversion units;

a second substrate including a second set of photoelectric conversion units; and an insulating layer between the first substrate and the second substrate;

where the insulating layer has a capability to reflect a first wavelength range of light and transmit a second wavelength range of light that is longer than the first wavelength range of light.

(B7)

The electronic apparatus according to according to (B6), further including:

an optical system that directs light propagating from an imaged object to the imaging device.

(B8)

The electronic apparatus according to according to one or more of (B6) to (B7), further including:

a control unit that controls an overall drive state of the imaging device.

(B9)

The electronic apparatus according to according to one or more of (B6) to (B8), further including:

a light source; and an optical filter, where the light source emits light that transmits through the optical filter towards an imaged object.

(B10)

The electronic apparatus according to according to one or more of (B6) to (B9), further including:

at least one of a logic circuit and a memory circuit provided on a side of the second substrate that is furthest from the insulating layer.

(B11)

The electronic apparatus according to according to one or more of (B6) to (B10), further including:

an optical filter located on a side of the first substrate that is furthest from the insulating layer, where the optical filter transmits incoming light to the second set of photoelectric conversion units.

(B12)

The electronic apparatus according to according to one or more of (B6) to (B11), where the optical filter transmits only a part of wavelength band $\lambda_O$ among the infrared light band such that a mixed color of the incoming light is reduced in the first set of photoelectric conversion units.

(B13)

The electronic apparatus according to according to one or more of (B6) to (B12), where the first wavelength range of light that is reflected is visible light reflected into the first set of photoelectric conversion units, and where the second wavelength range of light that is transmitted is infrared light transmitted into the second set of photoelectric conversion units.

(B14)

An imaging device, including:
a first substrate including a first set of photoelectric conversion units;
a second substrate including a second set of photoelectric conversion units; and
an insulating layer between the first substrate and the second substrate;
where the insulating layer has a capability to reflect a first wavelength range of light and transmit a second wavelength range of light that is longer than the first wavelength range of light.

(B15)

The imaging device according to according to (B14), further including:
an optical system that directs light propagating from an imaged object to the imaging device.

(B16)

The imaging device according to according to one or more of (B14) to (B15), further including:
a control unit that controls an overall drive state of the imaging device.

(B17)

The imaging device according to according to one or more of (B14) to (B16), further including:
a light source; and
an optical filter,
where the light source emits light that transmits through the optical filter towards an imaged object.

(B18)

The imaging device according to according to one or more of (B14) to (B17), further including:
at least one of a logic circuit and a memory circuit provided on a side of the second substrate that is furthest from the insulating layer.

(B19)

The imaging device according to according to one or more of (B14) to (B18), further including:
an optical filter located on a side of the first substrate that is furthest from the insulating layer, where the optical filter transmits incoming light to the second set of photoelectric conversion units.

(B20)

The imaging device according to according to one or more of (B14) to (B19), where the first wavelength range of light that is reflected is visible light reflected into the first set of photoelectric conversion units, and where the second wavelength range of light that is transmitted is infrared light transmitted into the second set of photoelectric conversion units.

REFERENCE SIGNS LIST 1 image capturing system
10 image sensor
20 light source
30 control unit
40 optical system
101 long wavelength sensor array
103 insulator layer
105 short wavelength sensor array
107 visible light wavelength selection filter
109 light collection structural element
111 optical filter
121,123 pixel line layer
151 semiconductor layer

The invention claimed is:

1. An imaging device, comprising:
a first pixel unit that converts light of a first wavelength range into a first charge, wherein the first pixel unit is driven with a low drive voltage;
a second pixel unit that converts light of a second wavelength range into a second charge, wherein the second pixel unit is driven with a high drive voltage; and
a light passing element, wherein a light transmittance for the second wavelength range is higher than for the first wavelength range,
wherein the light passing element is formed between the first pixel unit and the second pixel unit in a depth direction, and
wherein the first wavelength range includes a shorter wavelength than the second wavelength range.

2. The imaging device according to claim 1, wherein at least two first pixel units correspond to one second pixel unit.

3. The imaging device according to claim 1, further comprising:
a first wiring layer between the first pixel unit and the light passing element in the depth direction and
a second wiring layer under the second pixel unit in the depth direction.

4. The imaging device according to claim 3, wherein the first wiring layer includes a first wire electrically connected with a second wire of the second wiring layer by a through electrode.

5. The imaging device according to claim 1, wherein the light passing element comprises a multilayer film.

6. The imaging device according to claim 3, further comprising:
an optical filter on top of the first pixel unit in the depth direction.

7. The imaging device according to claim 3, further comprising:
a semiconductor layer under the second wiring layer in the depth direction.

8. The imaging device according to claim 1,
wherein the light of the first wavelength range comprises visible light, and
wherein the light of the second wavelength range comprises infrared light.

9. The imaging device according to claim 1, further comprising:
at least one of a logic circuit and a memory circuit.

10. The imaging device according to claim 1, further comprising:
a control unit that controls an overall drive state of the imaging device.

* * * * *